United States Patent
Nakayama et al.

(10) Patent No.: US 7,019,361 B2
(45) Date of Patent: Mar. 28, 2006

(54) SEMICONDUCTOR DEVICE AND METHOD OF FABRICATING THE SAME

(75) Inventors: Kazuya Nakayama, Sagamihara (JP); Bungo Tanaka, Yokohama (JP); Nobuyuki Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/037,158

(22) Filed: Jan. 19, 2005

(65) Prior Publication Data

US 2005/0121718 A1    Jun. 9, 2005

Related U.S. Application Data

(62) Division of application No. 10/405,627, filed on Apr. 3, 2003, now Pat. No. 6,958,514.

(30) Foreign Application Priority Data

Sep. 11, 2002  (JP) ............... 2002-265910
Feb. 3, 2003   (JP) ............... 2003-26033

(51) Int. Cl.
      *H01L 29/76* (2006.01)
(52) U.S. Cl. .................... 257/335; 257/341
(58) Field of Classification Search ............. 257/335, 257/340–342
      See application file for complete search history.

(56) References Cited

U.S. PATENT DOCUMENTS

| 5,869,875 A | 2/1999 | Hebert |
| 6,107,160 A | 8/2000 | Hebert et al. |
| 6,372,557 B1 | 4/2002 | Leong |
| 6,727,127 B1 | 4/2004 | Darmawan et al. |
| 2002/0030226 A1 | 3/2002 | Yasuhara et al. |
| 2004/0046202 A1 | 3/2004 | Nakayama et al. |
| 2005/0121718 A1* | 6/2005 | Nakayama et al. ......... 257/335 |

FOREIGN PATENT DOCUMENTS

JP   2002-158353   5/2002

* cited by examiner

*Primary Examiner*—Mark V. Prenty
(74) *Attorney, Agent, or Firm*—Oblon, Spivak, McClelland, Maier & Neustadt, P.C.

(57) ABSTRACT

A semiconductor device comprises a semiconductor substrate, a semiconductor layer formed above the semiconductor substrate, a plurality of unit cells each having a structure with a gate electrode disposed and formed above the semiconductor layer to have a stripe-like shape and with a source layer and a drain layer formed in the semiconductor layer to have stripe-like shapes respectively, a gate wiring line for mutually connecting together respective gate electrodes of the unit cells, a first main electrode being formed on a dielectric film covering the gate electrodes and the gate wiring line and being in contact with any one of the source layer and the drain layer of each unit cell, an impurity diffusion layer formed in the semiconductor layer to a depth reaching the semiconductor substrate only at part immediately underlying the gate wiring line, the part being selected from part immediately underlying a remaining one of the source layer and the drain layer of each unit cell and part immediately underlying the gate wiring line, the impurity diffusion layer being for permitting extension of the remaining one of the source and drain layers of each unit cell up to the semiconductor substrate, and a second main electrode as formed at a back surface of the semiconductor substrate.

6 Claims, 18 Drawing Sheets

SEMICONDUCTOR DEVICE AND METHOD OF FABRICATING THE SAME

CROSS-REFERENCE TO RELATED APPLICATIONS

This application is a divisional of U.S. application Ser. No. 10/405,627, filed Apr. 3, 2003, now U.S. Pat. No. 6,958,514, and is based upon and claims the benefit of priority from the prior Japanese Patent Application No. 2002-265910, filed on Sep. 11, 2002, and Japanese Patent Application No. 2003-26033, filed on Feb. 3, 2003, the entire contents of each of which are incorporated herein by reference.

BACKGROUND OF THE INVENTION

1. Field of the Invention

This invention relates to semiconductor devices with vertically structured or vertical-access transistors formed on a semiconductor substrate, and also relates to a fabrication method thereof.

2. Description of Related Arts

Traditionally, electronic equipment such as personal computers (PCs) and information communication apparatus or the like is typically designed to employ a power supply unit with a DC-to-DC converter built therein. In recent years, electronic equipment becomes smaller in size and lower in its drive voltage while its drive current becomes larger. With this trend, a power supply unit is desired which is capable of efficiently flowing a large current and also offering the handleability of higher frequencies. Thus it is required that power semiconductor devices for use in such power supply unit be low in turn-on resistance while at the same time offering enhanced switching performance at high speeds.

A typical prior known approach to meet the requirements is to use Schottky diodes as rectifier circuit elements in this type of power supplies. In contrast, a recently popularized approach to enabling flow of a large current at further lower voltages is to employ power metal oxide semiconductor field effect transistors (MOSFETs) as the rectifying devices in place of the Schottky diodes. More specifically, for power supply units, rectifier power MOSFETs are used in addition to switching power MOSFETs which switch between an input and output. These power supplies are generally called synchronous rectifier circuit scheme-type power supplies in view of the fact that switching operations are generally performed while letting rectifying power MOSFETs operate in a way synchronized with switching power MOSFETs.

FIG. 29 is an enlarged cross-sectional view of one prior art power MOSFET (for example, Published Unexamined Japanese Patent Application Nos. 2002-158353 and 2002-26321). The power MOSFET of FIG. 29 has a symmetrical structure with a dash-dot line as its boundary. When looking at part on the left side of this dash-dot line, the structure of this power MOSFET will be explained as follows. On a semiconductor substrate 1001 of heavily-doped p (p$^+$) conductivity type, a lightly-doped p (p$^-$) type epitaxial layer 1002 is formed. A plurality of unit cells are disposed and formed in this p$^-$-type layer 1002, thereby making up a MOSFET. More specifically, a p-type base layer 1003 is formed in the p$^-$-type layer 1002, with an n$^+$-type source layer 1004 being formed within the p-type base layer 1003 and with an n-type drain layer 1005 formed outside the p-type base layer 1003. The n-type drain layer 1005 involves an n-type high-resistance drain layer 1005a and an n$^+$-type low-resistance drain layer 1005b.

At a p-type layer surface portion between the source layer 1004 and the drain layer 1005, a gate electrode 1007 is formed with a gate dielectric film 1006 interposed therebetween. An electrically shorting electrode 1008 is formed, which is in contact with the source layer 1004 and p-type base layer 1003. To connect this "short" electrode 1008 to the substrate 1001 with low resistance therebetween, a p$^+$-type diffusion layer 1012 is formed to a depth reaching the substrate 1001. A source electrode 1011 is formed on the bottom or back surface of the substrate 1001. The surface on which the gate electrode 1007 is formed is covered with an interlayer dielectric film 1009, on which film a drain electrode 1010 is formed. The drain electrode 1010 is made up of a first-layer metal 1010a and a second-layer metal 1010b. The first metal 1010a is formed simultaneously during formation of the short electrode 1008 so that it comes into contact with the n$^+$-type drain layer 1005b. The second metal 1010b is formed on the interlayer dielectric film 1009.

Additionally, a MOSFET is known which has a reverse structure that is opposite in source electrode and drain electrode positions to the MOSFET shown in FIG. 29 with a silicide layer formed on or above contact portions between the source electrode and the epitaxial layer and also above the gate electrode (as disclosed for example in U.S. Pat. No. 6,218,712).

In the vertically structured or "vertical access" MOSFET of FIG. 29, the short electrode 1008 that electrically short-circuits together the source layer 1004 and the p-type base layer 1003 is formed on the surface of epitaxial layer 1002 in order to form the source electrode 1011 on the back surface of the substrate 1001. Additionally the p$^+$-type diffusion layer 1012 is formed to connect this short electrode 1008 to the substrate 1001. Since the p$^+$-type layer 1012 is a deep diffusion layer to be formed by impurity diffusion for an increased length of time period, it significantly expands in the lateral direction also. However, this p$^+$ layer 1012 must be designed so that it does not reach a channel region. When taking into consideration both the lateral expansion of the p$^+$ layer 1012 and the required margin space or clearance with respect to the channel region, it is a must to enlarge the width of unit cells. An increase in unit cell width would result in an increase in area of the MOSFET. When the MOSFET area is limited, the unit cells that can be laid out within the MOSFET decrease in number. This makes it difficult to sufficiently satisfy two trade-off characteristics, that is, low turn-on resistance and high-speed switching performance.

SUMMARY OF THE INVENTION

A semiconductor device in accordance with one aspect of this invention comprises a semiconductor substrate, a semiconductor layer formed above the semiconductor substrate, a plurality of unit cells each having a structure in which a gate electrode is disposed and formed above the semiconductor layer to have a stripe-like shape while letting a source layer and a drain layer be formed in the semiconductor layer to have stripe-like shapes respectively, a gate wiring line for mutually connecting together respective gate electrodes of the unit cells, a first main electrode which is formed on a dielectric film covering the gate electrodes and the gate wiring line and which is in contact with any one of the source layer and the drain layer of each unit cell, an impurity diffusion layer which is formed in the semiconductor layer to a depth reaching the semiconductor substrate only at part immediately underlying the gate wiring line, the part being selected from part immediately underlying a remaining one of the source layer and the drain layer of each unit cell and part immediately underlying the gate wiring line, the impurity diffusion layer being for permitting extension of the remaining one of the source and drain layers of each unit cell up to the semiconductor substrate, and a second main electrode as formed at a back surface of the semiconductor substrate.

A semiconductor device in accordance with another aspect of this invention comprises a semiconductor substrate, a semiconductor layer formed above the semiconductor substrate, a plurality of unit cells each having a structure with a gate electrode disposed and formed above the semiconductor layer to have a stripe-like shape and with a source layer and a drain layer formed in the semiconductor layer to have stripe-like shapes respectively, a gate wiring line for mutually connecting together respective gate electrodes of the unit cells, a gate oxide film formed under the gate electrode, an oxide film formed under the gate wiring line and at the same layer as the gate oxide film to have a thickness greater than a thickness of the gate oxide film, the thickness of the oxide film being greater than equal to 40 nm and yet less than 100 nm, a first main electrode which is formed on a dielectric film covering the gate electrodes and the gate wiring line and which is in contact with any one of the source layer and the drain layer of each unit cell, an impurity diffusion layer of p type as formed in the semiconductor layer at a location immediately beneath the gate wiring line to a depth reaching the semiconductor substrate, for permitting extension of a remaining one of the source and drain layers of each unit cell up to the semiconductor substrate, another impurity diffusion layer of p type as formed in the semiconductor layer at a location immediately beneath the remaining of the source and drain layers of each unit cell to a depth reaching the semiconductor substrate, for permitting extension of the remaining one of the source and drain layers of each unit cell up to the semiconductor substrate, and a second main electrode as formed at a back surface of the semiconductor substrate.

A semiconductor device in accordance with a further aspect of this invention comprises a semiconductor substrate having one surface and a remaining surface on the opposite side thereof, a semiconductor layer which is formed on the one surface side of the semiconductor substrate and which has a surface, a source layer and a drain layer formed in the surface of the semiconductor layer so that these are spaced apart from each other, a gate electrode formed above a portion of the surface of the semiconductor layer between the source layer and the drain layer with a gate dielectric film interposed therebetween, a base layer which is formed in the surface of the semiconductor layer and which is in conductivity type from the source layer, a short electrode which is formed above the surface of the semiconductor layer for electrically short-circuiting the base layer and the source layer together and which includes a metallic compound material of a high-melting-point metal and a semiconductor material of the semiconductor layer, an interlayer dielectric film which is formed above the surface of the semiconductor layer in such a manner as to cover the gate electrode and the short electrode and which has a contact hole formed above the drain layer, a drain electrode which is connected to the drain layer via the contact hole and is formed above the interlayer dielectric film, and a source electrode connected on the remaining surface side of the semiconductor substrate.

A method of fabricating a semiconductor device in accordance with the invention is a fabrication method of a semiconductor device having a structure with an epitaxial layer formed above one surface of a semiconductor substrate, with a gate electrode and a drain electrode formed over the epitaxial layer, with a source layer and a drain layer and a base layer be formed in a surface of the epitaxial layer, and with a source electrode formed above a remaining surface of the semiconductor substrate. The method comprises selectively removing a first interlayer dielectric film formed above the epitaxial layer in such a manner as to cover the gate electrode to thereby form an opening for causing exposure of a region including therein a boundary between the base layer and the source layer, forming a high-melting-point metal film at an overall surface of the first interlayer dielectric film including the exposed region by the opening, applying thermal processing to the high-melting-point metal film to thereby form a short electrode including a silicide layer at a location overlying the region including the boundary between the base layer and the source layer, removing unreacted part of the high-melting-point metal film, forming a second interlayer dielectric film to cover the short electrode and the first interlayer dielectric film, selectively removing the second interlayer dielectric film to form a contact hole above the drain layer, and forming the drain electrode above the second interlayer dielectric film and within the contact hole.

DETAILED DESCRIPTION OF THE INVENTION

Several illustrative embodiments (Embodiments 1 to 12) of this invention will be explained with reference to the accompanying drawings below. A principal feature of Embodiments 1–7 lies in provision of a heavily-doped impurity diffusion layer for permitting extension of either a source layer or a drain layer up to a silicon substrate, wherein the heavily-doped impurity diffusion layer is formed in an epitaxial layer at a location immediately beneath a gate wiring line to a depth reaching the silicon substrate. In contrast, a main feature of Embodiments 8–12 is that a shorting or "short" electrode for electrically short-circuiting circuiting a base layer and source layer together is constituted from a silicide layer.

Although the embodiments as will be discussed below are directed to vertically structured or "vertical" n-channel MOSFETs, the principles of the invention may also be applied similarly to p-channel MOSFETs with respective parts reversed in conductivity type. Also note that although examples using a silicon substrate will specifically be presented in the embodiments below, other available semiconductive substrates may alternatively be used, which are made of GaAs, SiC, GaN, SiGe, C and other similar suitable materials.

Embodiment 1

Figure 1:
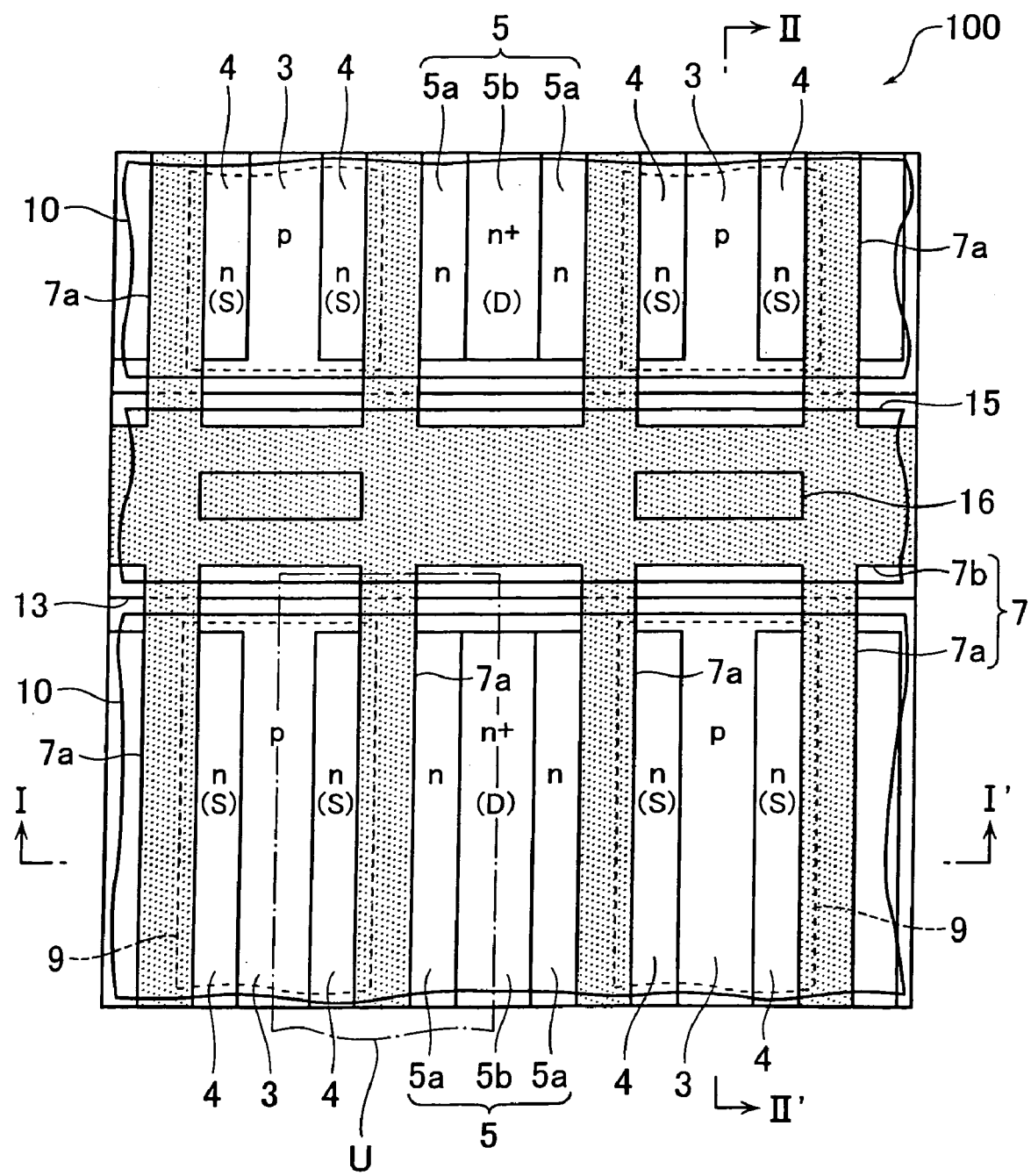
FIG. 1 is a diagram showing a plan view of main part of a MOSFET in accordance with an embodiment 1 of this invention.
Figure 2:
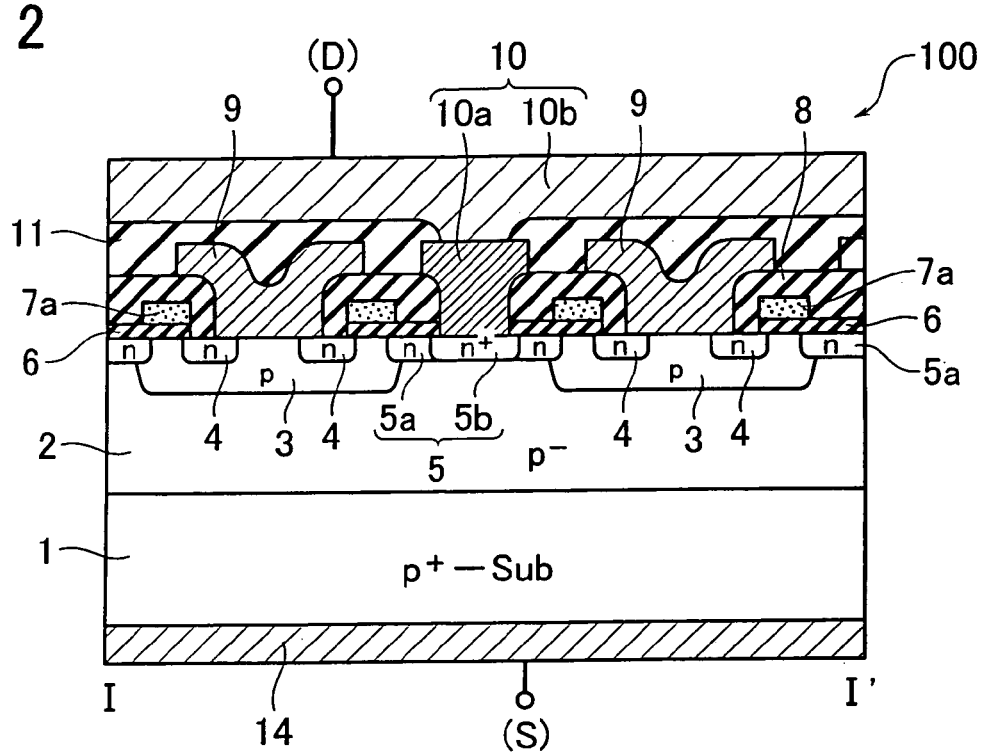
FIG. 2 is a cross-sectional view of the MOSFET as taken along line I—I' of FIG. 1.
Figure 3:
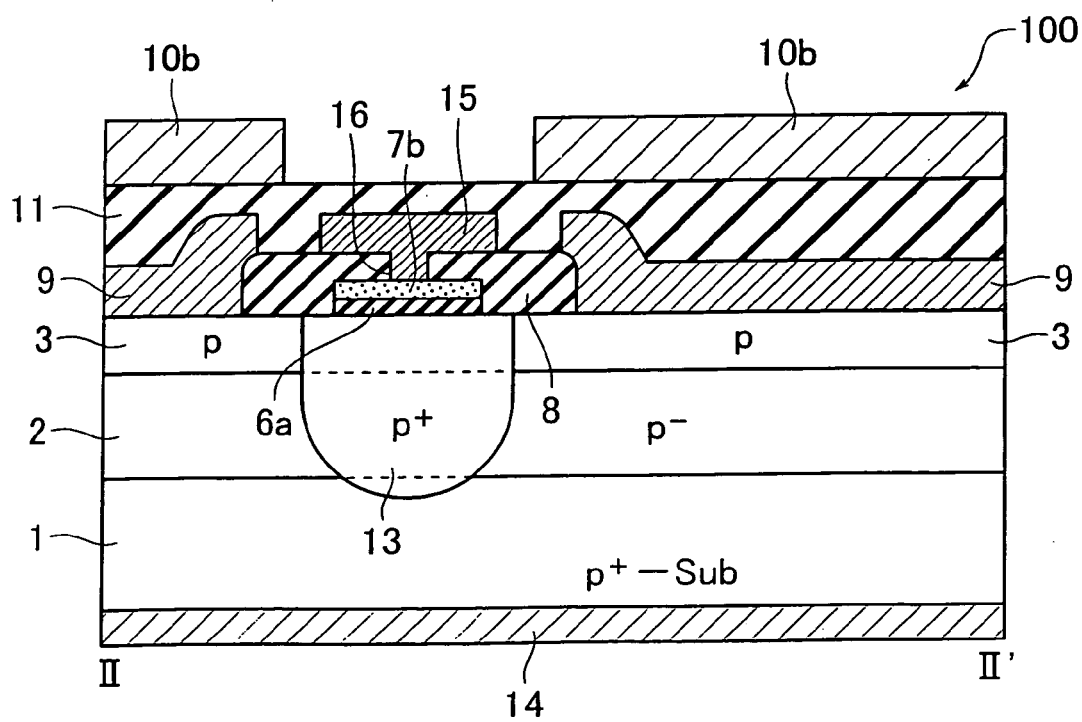
FIG. 3 is a cross-sectional view along line II—II' of FIG. 1.

FIG. 1 illustrates an enlarged partial plan view of a vertical-access MOSFET 100 in accordance with an embodiment 1 of the invention. FIGS. 2 and 3 are cross-sectional views of the vertical MOSFET 100 as taken along lines I—I' and II—II' of FIG. 1, respectively. This MOSFET 100 is manufacturable by use of a wafer having a heavily-doped p ($p^+$) type silicon substrate 1 with high impurity concentration and low resistance and a lightly-doped p ($p^-$) type epitaxial layer 2 of low impurity concentration and high resistance, which is formed on the $p^+$-type silicon substrate 1. The $p^-$-type epitaxial layer 2 has its surface in which a great number of unit cells are laid out into a matrix form, with a range indicated by dash-dot lines in FIG. 1 as a unit cell U.

A more concrete explanation is as follows. A p-type base layer 3 is formed in the $p^-$-type epitaxial layer 2. In the cross-section of FIG. 2, the p-type base layer 3 is formed so that a plurality of layer portions or components are laid out at prespecified intervals or layout pitches in such a manner that a region in which a drain layer 5 will be formed later is laterally interposed between adjacent ones of the layer components, which will later be continuously coupled together under a region in which a gate wiring line 15 will be formed later. To let the both terminate end portions of this p-type base layer 3 in the I—I' cross-section be a channel region, a gate electrode 7 is formed through a gate dielectric film 6. The gate electrode 7 is made up of a great number of stripe portions 7a which are laid out along the both ends of the p-type base layer 3 and a coupling portion 7b for mutually coupling these stripe portions 7a together, thereby arranging a mesh-like planar pattern. Each stripe portion 7a functions as a substantial or "net" gate electrode. An oxide film 6a underlying the coupler portion 7b is the one that was formed simultaneously during formation of the gate dielectric film (gate oxide film) 6, wherein its thickness is the same as that of the gate dielectric film 6.

Two neighboring unit cells in a direction perpendicular to the stripe portions 7a of the gate electrode 7 commonly have or "share" a single p-type base layer 3. Within this p-type base layer 3, an n-type source layer 4 of each unit cell is formed so that it is self-aligned with the stripe portions 7a of the gate electrode 7. An n-type drain layer 5 is formed outside the p-type base layer 3. The drain layer 5 is of a lightly doped drain (LDD) structure having an n-type high-resistance drain layer 5a and an $n^+$-type low-resistance drain layer 5b, which is later formed at a central portion of the layer 5a.

The gate electrode 7 is covered or coated with an interlayer dielectric film 8. On this film 8, an electrically shorting or "short" electrode 9 is formed as indicated by dotted lines in FIG. 1. This short electrode 9 is made of a first-layer metal and is shared by two neighboring unit cells. The short electrode 9 is in contact, through a contact hole defined in the interlayer dielectric film 8, with two n-type source layers 4 within a p-type base layer 3 and a p-type base layer 3 laid therebetween. The short electrode 9 functions as the source electrode of each unit cell.

In cases where the gate electrode is made of polycrystalline silicon or "poly-silicon," a back-plated wiring line (gate wiring lead) 15 is formed so that it overlaps the coupler portion 7b of the gate electrode 7 for lowering the electrical resistance of this gate electrode 7. The gate wiring line 15 is formed of the first-layer metal that is the same as the short electrode 9 and is contacted with the coupler portion 7b through contact holes which are defined in the interlayer dielectric film 8 at predetermined intervals.

A drain electrode 10 is formed over the short electrode 9 and the gate wiring line 15 with an interlayer dielectric film 11 interposed or "sandwiched" therebetween. More specifically, the drain electrode 10 is structured from contact electrodes 10a and a main electrode 10b. The contact electrodes 10a are formed of the first-layer metal same as the short electrode 9 so that each is contacted with its associative $n^+$-type drain layer 5b. The main electrode 10b is formed of a second-layer metal for coupling these contact electrodes 10a together. The main electrode 10b is prevented from being disposed above the gate wiring line 15. This is aimed at preclusion of formation of any unwanted parasitic capacitance otherwise creatable due to the main electrode 10b and the gate wiring line 15.

A source electrode 14 is formed on the bottom or back surface of the p⁺-type silicon substrate 1. In this embodiment, a p⁺-type diffusion layer 13 for making low-resistance connection of the short electrode 9 to the p⁺-type Si substrate 1 is not formed immediately beneath the short electrode 9 but is continuously formed immediately beneath the coupler portion 7b of gate electrode 7—thus, just below the gate wiring line 15—to a predetermined depth reaching the substrate 1 while extending along the gate wiring line 15. Accordingly, unlike the prior art of FIG. 29, the short electrode 9 is prevented from being in direct contact with the p⁺-type layer 13. However, the p-type base layer 3 of each unit cell with which the short electrode 9 is contacted is integrally formed in such a way as to continue at part immediately underlying the gate wiring line 15 while letting the p⁺-type layer 13 be formed to overlap the p-type base layer 3 at a location immediately beneath this gate wiring line 15. Thus it is possible to connect the short electrode 9 to the substrate 1 with low electrical resistance.

An operation of the MOSFET 100 arranged in the way stated above is as follows. This MOSFET operates to turn on when a positive voltage is applied to the gate electrode 7. At this time, the channel that underlies each stripe portion 7b of the gate electrode 7 inverts resulting in establishment of electrical conduction between the drain electrode 10 and the short electrode 9. A drain current rushes to flow through the p-type base layer 3 in the deep p⁺-type diffusion layer 13 immediately underlying the gate wiring line 15 and then flows into the source electrode 14 through the substrate 1.

According to this embodiment, the deep p⁺-type diffusion layer 13 is formed in an inherently useless or "invalid" region of the MOSFET which is immediately below the gate wiring line 15, which is selected from the part immediately underlying the source layer 4 of each unit cell and the part just beneath the gate wiring line 15. With such an arrangement, it is possible to lay out an increased number of ultra-fine unit cells. Consequently, even when arranging a DC—DC converter circuit by on-chip integration of multiple MOSFETs, it is possible to reduce the onchip occupation area thereof.

Embodiment 2

Figure 4:
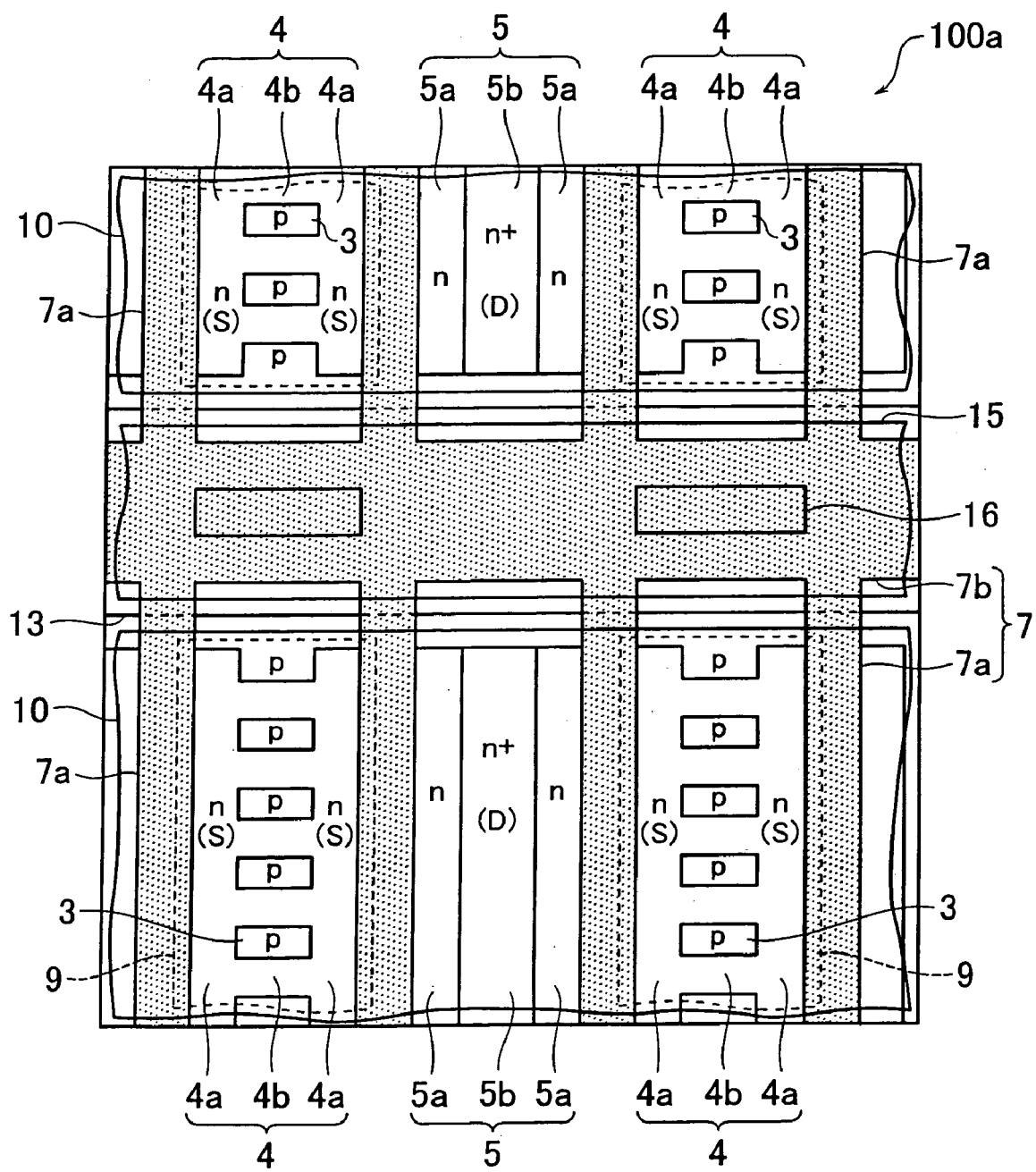
FIG. 4 illustrates a plan view of main part of a MOSFET in accordance with an embodiment 2 of the invention.

FIG. 4 depicts an enlarged partial plan view of a vertical MOSFET 100a in accordance with an embodiment 2 of the invention in a way corresponding to FIG. 1. A difference of it from the Embodiment 1 is that the source layers 4 of two neighboring unit cells to be formed within the p-type base layer 3 are formed to have a ladder-shaped planar pattern made up of stripe portions 4a extending along the stripe portions 7a of gate electrode 7 and coupling portions 4b for coupling them together at specified layout intervals or pitches. Accordingly, the short electrode 9's contact with the p-type base layer 3 becomes an opening of the source layer 4 of such ladder-like pattern. The other arrangements are similar to Embodiment 1.

As previously discussed in conjunction with Embodiment 1, disposing the deep p⁺-type diffusion layer 13 at the location immediately beneath the gate wiring line 15 makes it possible to lessen the unit cell width of the MOSFET. Unfortunately, narrowing the unit cell width in the I—I' cross-section of FIG. 2 would result in a likewise decrease in width of the short electrode 9 to be disposed between the two neighboring stripe portions 7a of the gate electrode 7. This makes it difficult to let the short electrode 9 come into contact with both the source layer 4 and the base layer 3. On the other hand, when the source layer 4's width (the width of a portion extending in parallel to the gate electrode stripe portions 7a) is made larger in order to increase the reliability of contact of the short electrode 9 with respect to the source layer 4, a portion of the base layer 3 which is immediately beneath the source layer 4 becomes greater in resistance in the lateral direction. This can result in a decrease in the efficiency of "pump-out" of holes—these holes are produced by impact ionization near the drain in turn-on events—toward the short electrode 9, which in turn leads to reduction of the capability to withstand against avalanches, called the avalanche ratings.

According to this embodiment, it is possible by forming the source layer 4 into a ladder-like planar pattern to suppress or minimize an increase in lateral-directional resistance of the base layer 3 while at the same time permitting the stripe portions 4a of source layer 4 to stay smaller in width. Thus it is possible to achieve high-reliability electrical contact of the short electrode 9 with the source layer 4 while retaining enhanced avalanche ratings.

Embodiment 3

Figure 5:
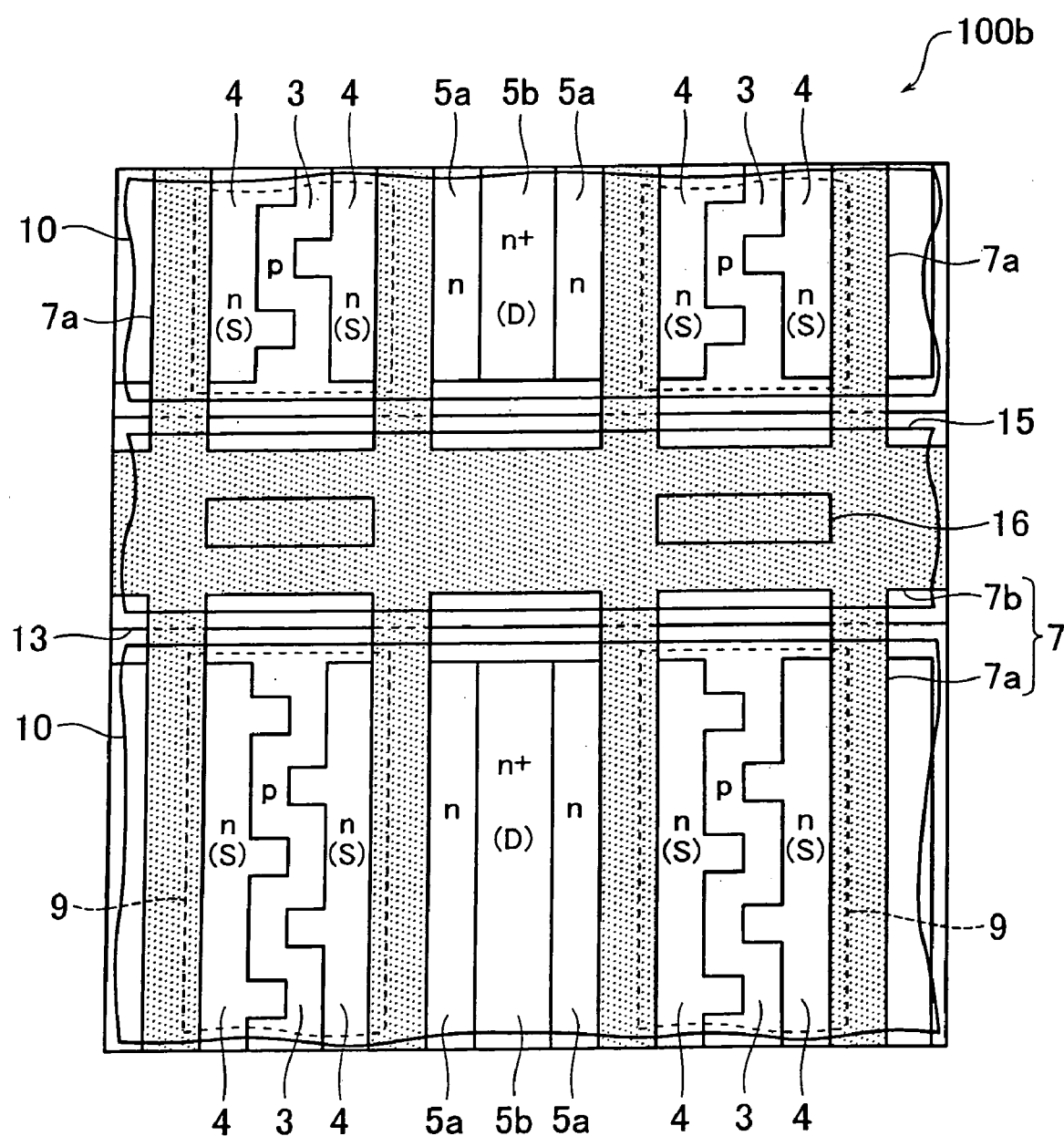
FIG. 5 depicts a plan view of main part of a MOSFET in accordance with an embodiment 3 of the invention.

FIG. 5 shows an enlarged partial plan view of a MOSFET 100b in accordance with an embodiment 3 in a way corresponding to FIGS. 1 and 4. In this embodiment, the shape of the source layer 4 is arranged to have a combined or "compromised" form of those of Embodiments 1 and 2. More specifically, two source layers 4 within a p-type base layer 3 are formed to have a concavo-convex pattern offset structure. In other words, the source layers 4 have their pn junction terminate ends which are of mutually mated comb-shaped patterns. The other arrangements are the same as those of Embodiment 1.

In this embodiment, designing the source layers 4 to have the offset structure makes it possible to acquire and retain any required areas of the contacts between the short electrode 9 and source layers 4 and also between the short electrode 9 and p-type base layer 3 even in cases where the source layers 4 are less in width. This in turn makes it possible to further improve the avalanche ratings when compared to Embodiment 2.

Embodiment 4

Figure 6:
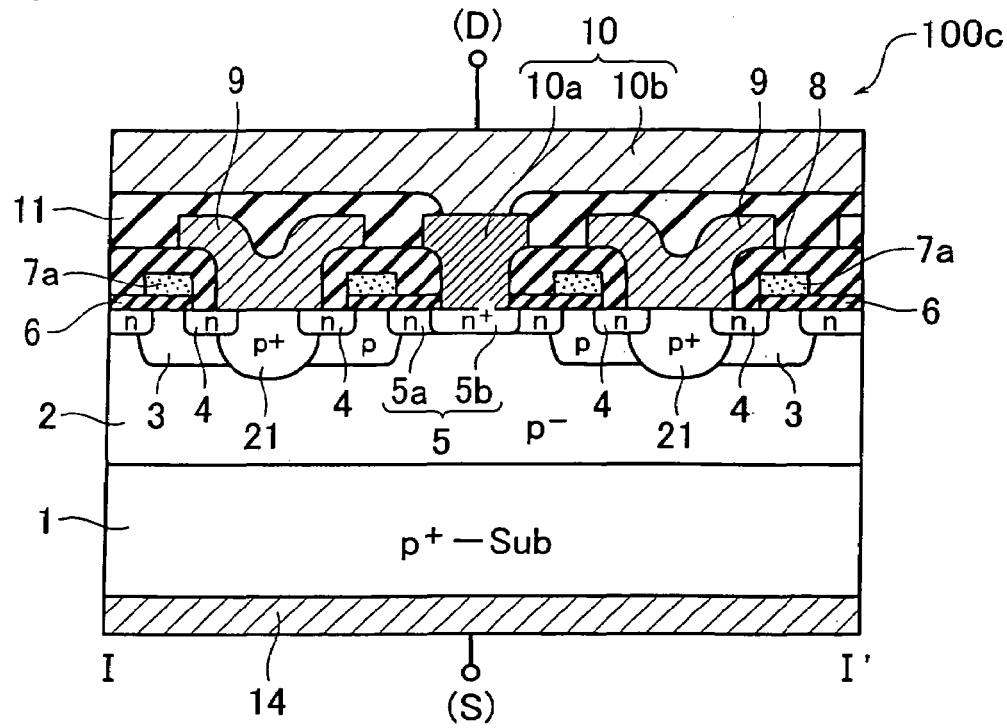
FIG. 6 is a sectional view of a MOSFET in accordance with an embodiment 4, which corresponds to FIG. 2.

FIG. 6 illustrates in cross-section main part of a MOSFET 100c in accordance with an embodiment 4 in a way corresponding to FIG. 2. This embodiment is similar to Embodiment 1 with an additional feature which follows: a shallow p⁺-type diffusion layer 21 is further formed between two neighboring source layers 4 within the p-type base layer 3. This diffusion layer 21 is higher in impurity concentration than p-type base layer 3. Whereby, the electrical contact properties between the short electrode 9 and p-type base layer 3 becomes more excellent. Furthermore, providing this p⁺-type diffusion layer 21 results in a further decrease in resistance of the region spanning from the source of each unit cell up to the deep p⁺-type diffusion layer 13. This makes it possible to further lower the turn-on voltage.

Embodiment 5

Figure 7:
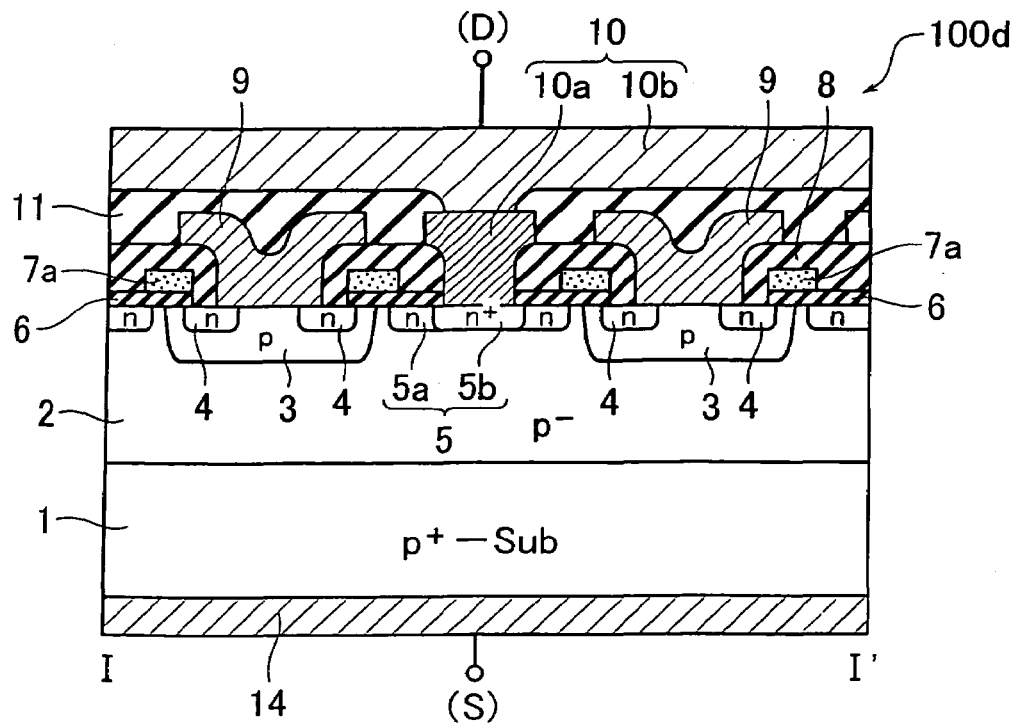
FIG. 7 is a sectional view of a MOSFET in accordance with an embodiment 5, which corresponds to FIG. 2.

FIG. 7 depicts in cross-section main part of a MOSFET 100d in accordance with an embodiment 5 in a way corresponding to FIG. 2. In the embodiments stated previously, there is shown a specific case where the p-type base layer 3 is fabricated prior to formation of the gate electrode 7. In contrast, this embodiment 5 shows a case where the gate electrode 7 is first fabricated and thereafter the p-type base layer 3 and source layers 4 are formed by impurity ion implantation with the gate electrode 7 as a mask and double diffusion. Accordingly, both the p-type base layer 3 and the source layers 4 are self-aligned with the gate electrode 7. With such an arrangement, the controllability of the channel region's width (channel length) is improved causing the threshold voltage controllability to improve accordingly. Any possible variation or irregularity of threshold voltages becomes smaller between wafers and/or between product lots.

Embodiment 6

Figure 8:
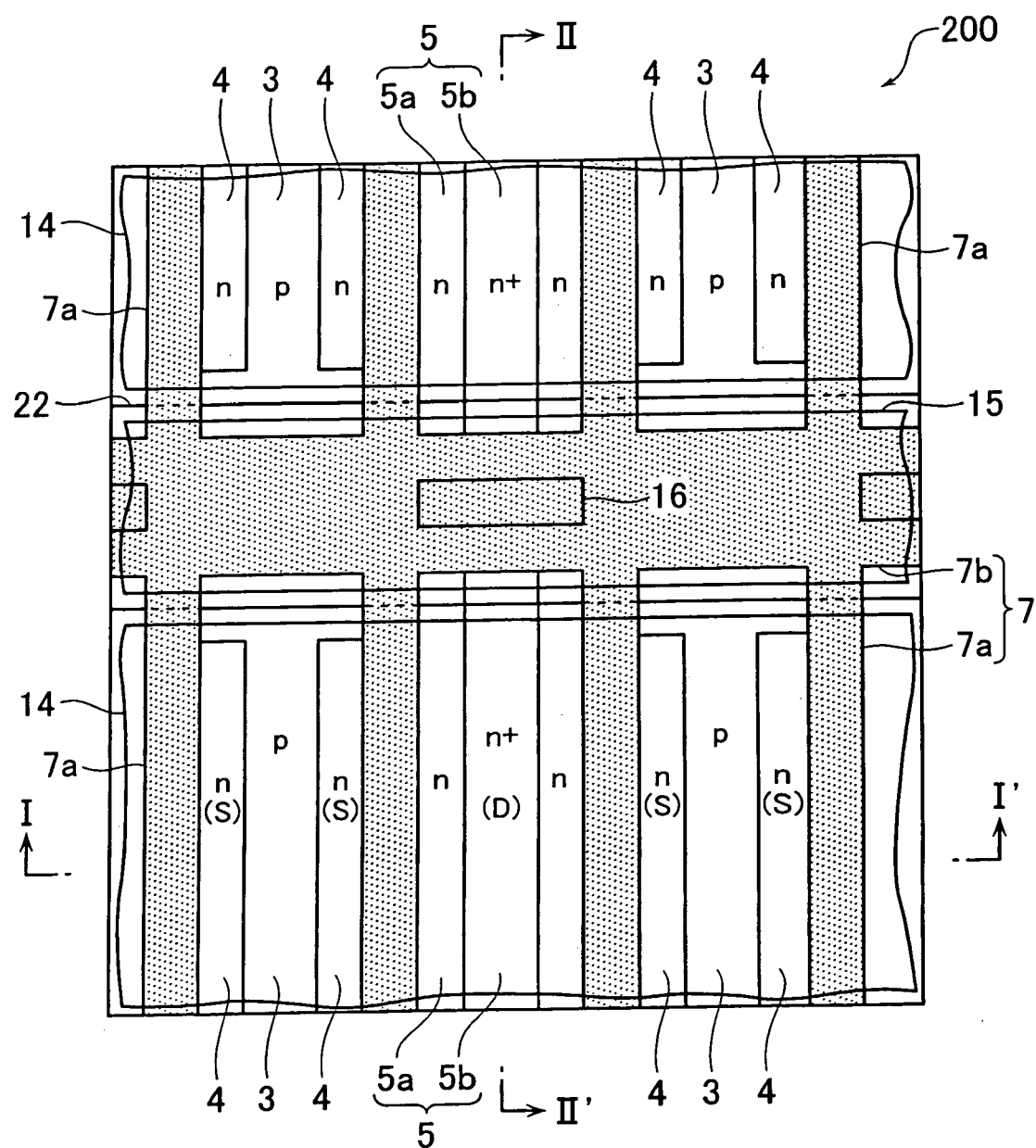
FIG. 8 shows a plan view of main part of a MOSFET in accordance with an embodiment 6 of the invention.
Figure 9:
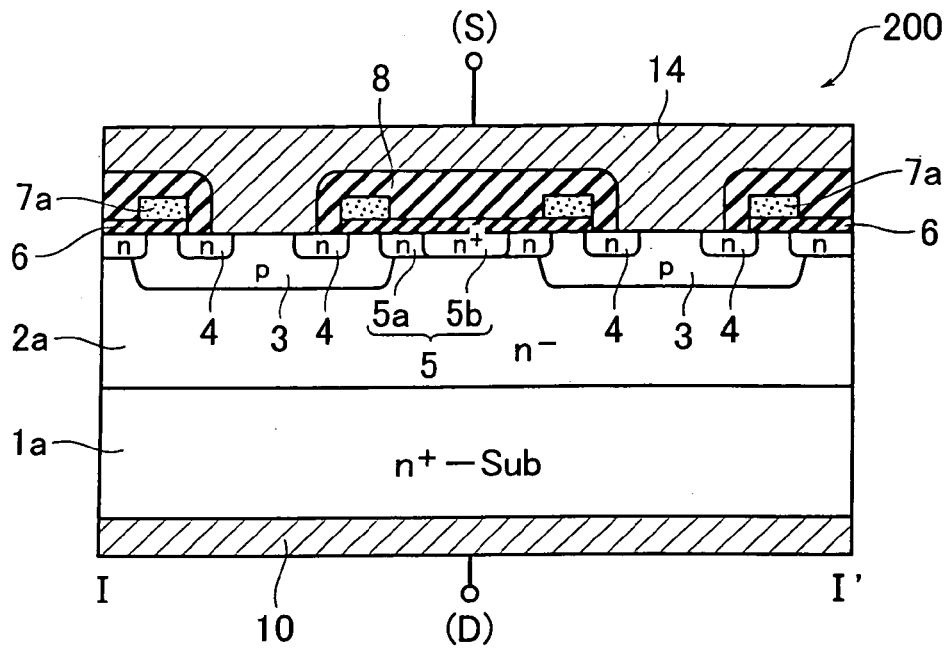
FIG. 9 is a sectional view taken along line I—I' of FIG. 8.
Figure 10:
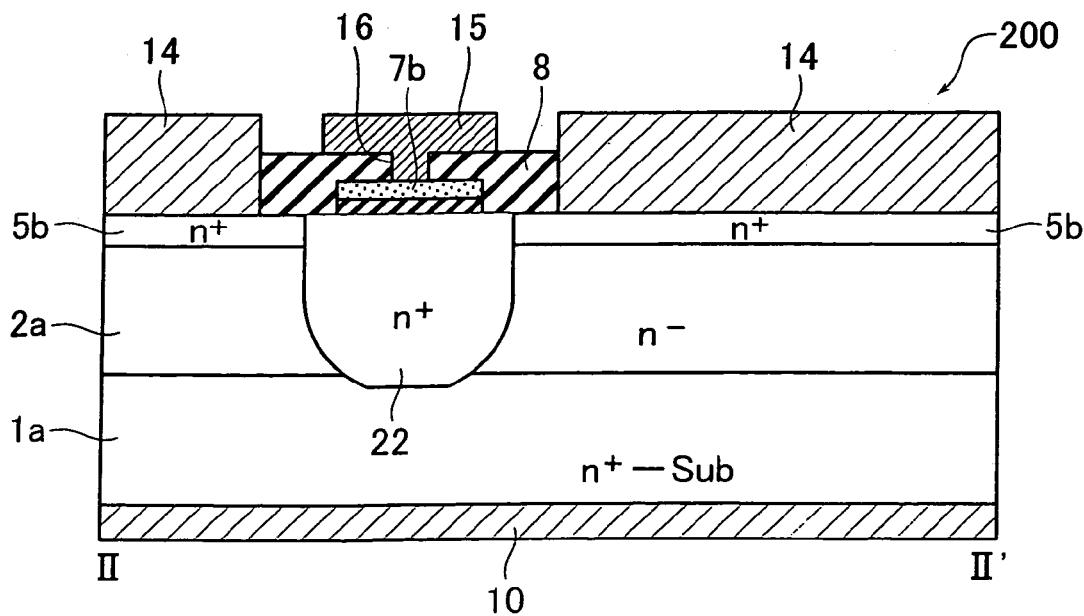
FIG. 10 is a sectional view along line II—II' of FIG. 8.

FIG. 8 is an enlarged partial plan view of a MOSFET 200 in accordance with an embodiment 6, with the source/drain electrodes being made opposite in up-down relation to the embodiments stated supra. FIGS. 9 and 10 are I—I' and II—II' cross-sectional views of FIG. 8, respectively. Parts or components corresponding to those of each of the previous embodiments are designated by the same reference characters, and a detailed explanation thereof is eliminated herein.

A difference of this embodiment from the embodiments discussed above is that the MOSFET is fabricated using a wafer with an n$^-$-type epitaxial layer 2a formed on an n$^+$-type silicon substrate 1a. This embodiment is similar to the above embodiments in that multiple unit cells are formed in the surface of n$^-$-type layer 2a. A source electrode 14 is formed on or above the substrate surface so that this electrode is in contact with n-type source layers 4 and p-type base layers 3. Accordingly, any electrode equivalent to the short electrode 9 used in the previous embodiments is absent. A drain electrode 10 is formed on the back surface of the substrate 1a.

The drain layer 5 has a low-resistance drain layer 5b. This layer 5b is continued with an n$^+$-type diffusion layer 22, which is formed immediately beneath the gate wiring line 15 to extend along the gate wiring line 15 to a depth reaching the substrate 1a. The low-resistance drain layer 5b is connected to the drain electrode 10 through this n$^+$-type diffusion layer 22 and also via the substrate 1a. The n$^+$-type diffusion layer 22 is the one that connects the drain 5 to the drain electrode 10 on the back face of substrate 1a and is the same in functionality to the p$^+$-type diffusion layer 13 which is used in each of the previous embodiments to connect the source layer(s) 4 to the source electrode 14 on the substrate back surface. And this n$^+$-type diffusion layer 22 is disposed at a location immediately underlying the gate wiring line 15, which is an invalid area of the MOSFET, in a similar way to a respective one of the previous embodiments, thereby permitting the unit cells to further decrease in size—that is, enabling microfabrication of such unit cells.

In this embodiment, no short electrodes are required. Thus it is possible to organize the metal wiring layers overlying the epitaxial layer into a single layer, which in turn makes it possible to further improve the on-chip integration density of the unit cells. Another advantage is that the interlayer dielectric film further decreases in thickness, resulting in enhancement of the ability to bury the source electrode 14 in contact holes.

Figure 11:
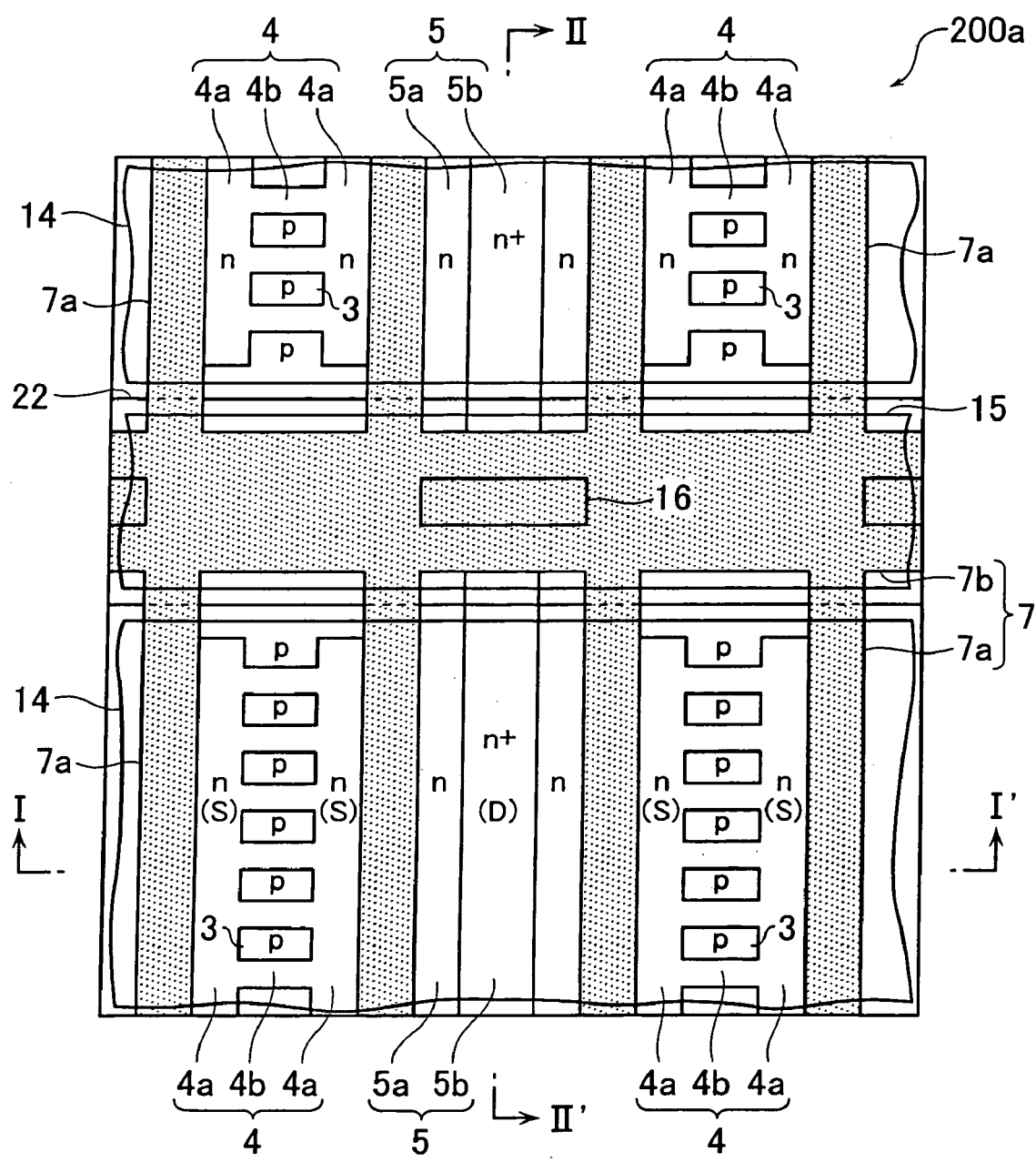
FIG. 11 is a plan view of main part of a MOSFET in accordance with a modified example of the embodiment 6.
Figure 12:
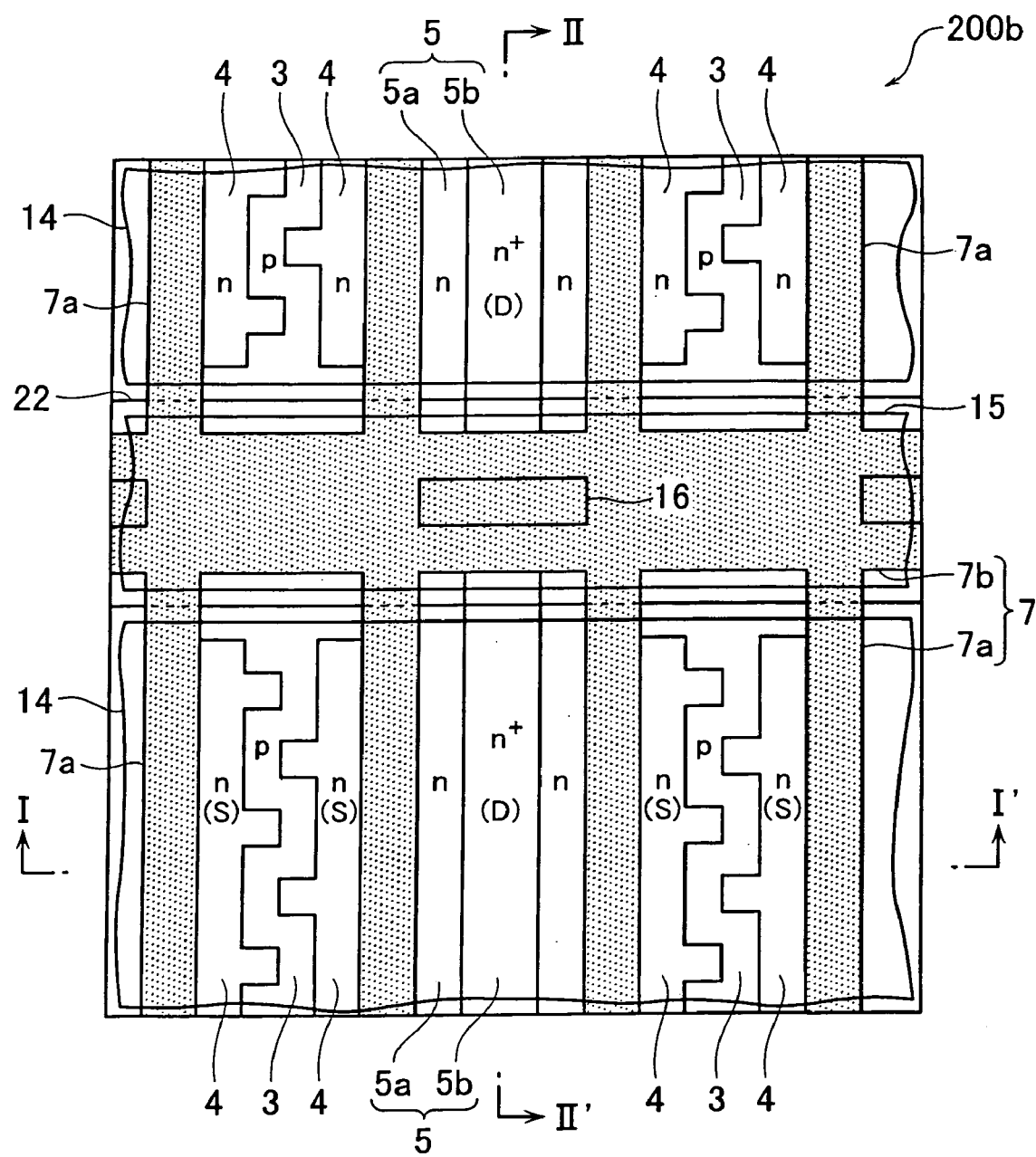
FIG. 12 is a plan view of main part of a MOSFET in accordance with another modification of the embodiment 6.

Regarding Embodiment 6, there are modified examples which follow. Embodiment 6 also is similar to the case of Embodiment 1 in that the contact area of the source electrode 14 with respect to the p-type base layers 3 and source layers 4 causes problems when the unit cells are microfabricated to have ultrafine sizes. Accordingly, similar modifications become effective which are similar to Embodiment 2 (FIG. 4) and Embodiment 3 (FIG. 5) with respect to Embodiment 1. A vertical-access MOSFET 200a of FIG. 11 is an example with its each source layer 4 designed to have a ladder-shaped pattern in a similar way to the embodiment of FIG. 4. A vertical MOSFET 200b of FIG. 12 is an example with its source layer 4 formed into a comb-like pattern in a similar way to the embodiment of FIG. 5.

It should be noted that although not specifically depicted, it is also effective to form a shallow p$^+$-type diffusion layer at a contact portion between the source electrode 14 and p-type base layer 3 as in the embodiment of FIG. 6 or alternatively to structurally modify the p-type base layer 3 and source layer 4 so that these are self-aligned with the gate electrode 7 as in the FIG. 7 embodiment.

Embodiment 7

Figure 13:
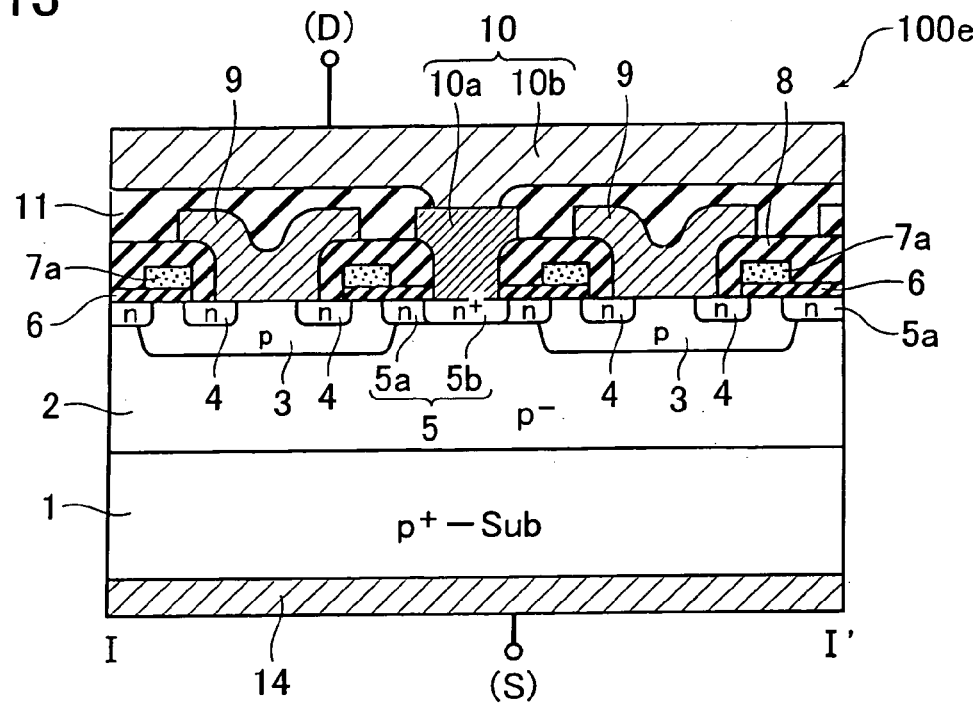
FIG. 13 is a sectional view of a MOSFET in accordance with an embodiment 7, which corresponds to FIG. 2.
Figure 14:
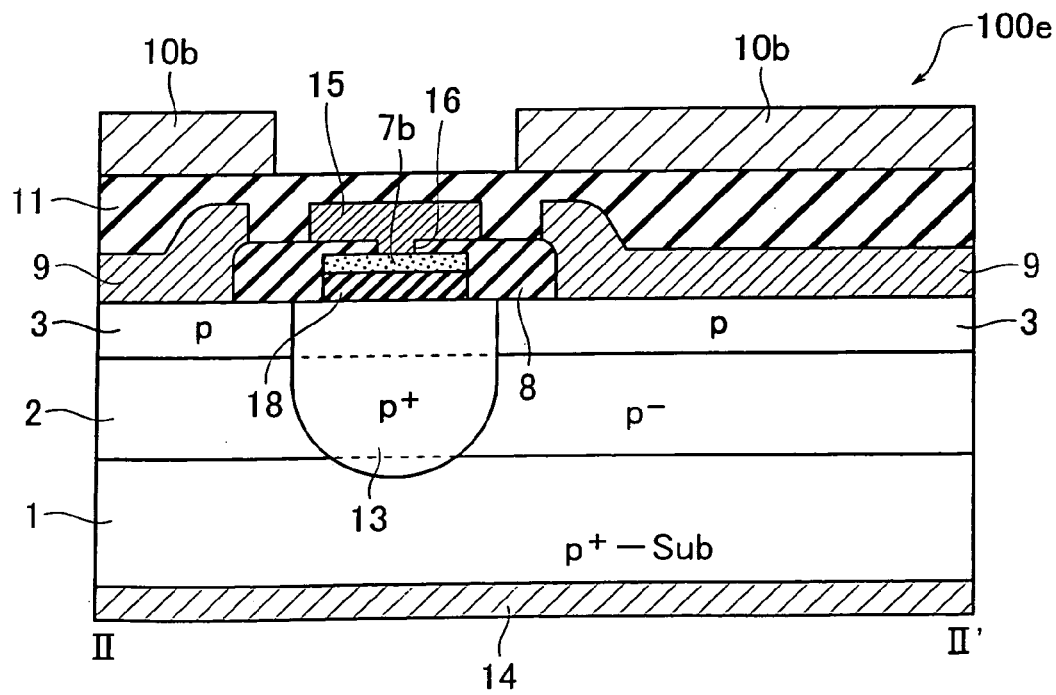
FIG. 14 is a sectional view of the MOSFET in accordance with the embodiment 7, which corresponds to FIG. 3.

FIGS. 13 and 14 show cross-sectional structures of a MOSFET 100e in accordance with an embodiment 7, which correspond to those shown in FIGS. 2 and 3, respectively. A feature unique to this embodiment is that an oxide film 18 underlying the gate wiring line 15 (this film 18 corresponds to the oxide film 6a under the gate wiring line 15 of FIG. 3 as has been set forth in Embodiment 1) is specifically formed so that its thickness falls within a prespecified range of 40 to 100 nanometers (nm)—more precisely, greater than or equal to 40 nm and less than 100 nm—and at the same time is greater than the thickness of the gate dielectric film (gate oxide film) 6 in FIG. 13. Relatively enlarging the oxide film 18's thickness is devoted to reduction of a parasitic capacitance between the gate wiring line 15 and the p$^+$-type diffusion layer 13. Additionally the oxide film 18 is formed in the same layer as the gate dielectric film 6.

An explanation is now given of the thickness of the oxide film 18 underlying the gate wiring line 15. First, regarding the thickness of oxide film 18, a with-time destruction distribution of the oxide film thickness shown in FIG. 15 has been obtained by reliability test results. The lateral axis of this graph indicates the thickness of a silicon oxide film, and the longitudinal axis shows the inverse number of a time at which the silicon oxide film causes destruction. It is apparent from viewing this graph of FIG. 15 that the with-time destruction distribution is in the tendency of saturation when the oxide film thickness exceeds about 40 nm. Thus it is can be seen that the thickness of oxide film 18 is required to measure 40 nm or greater.

Figure 16:
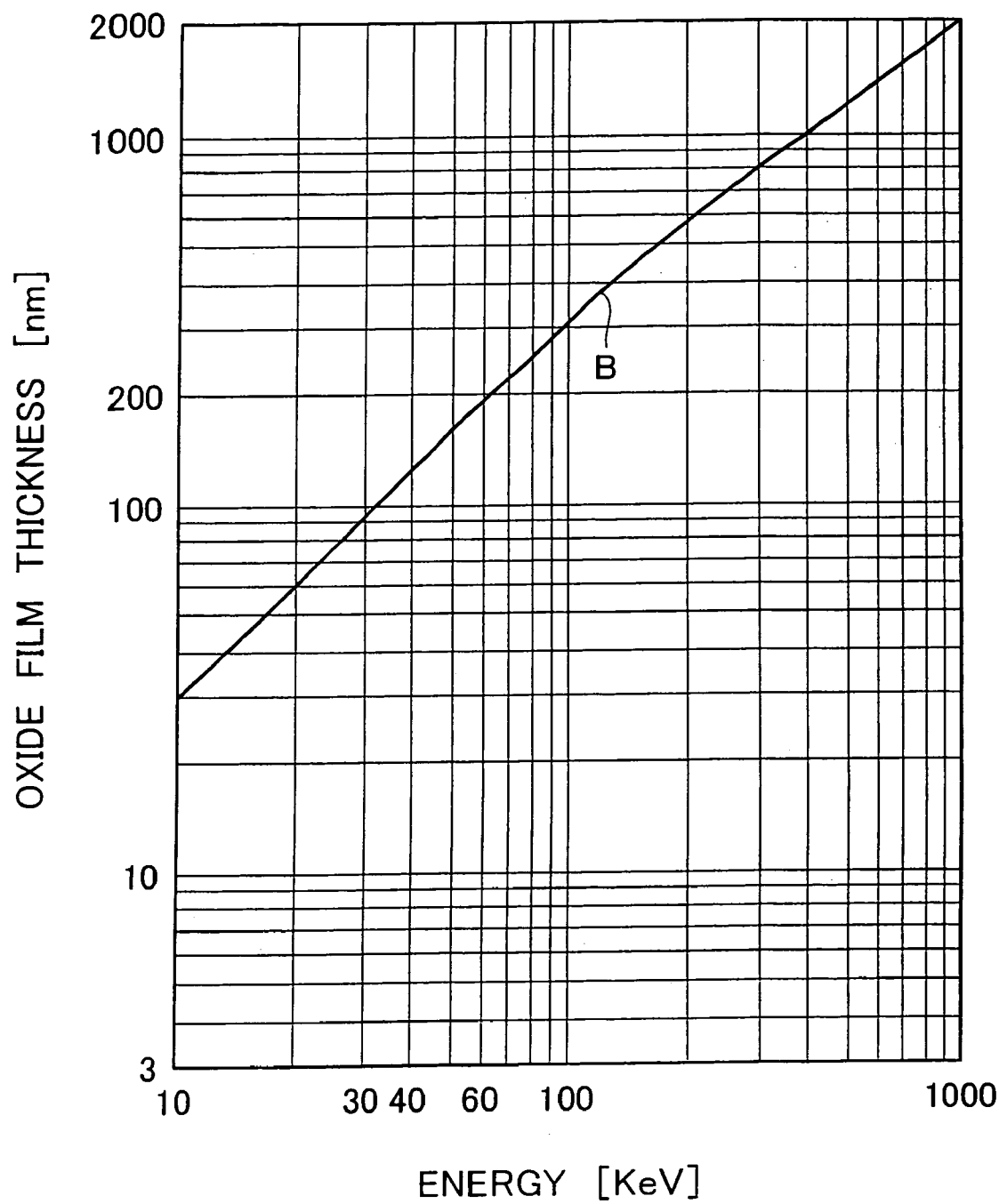
FIG. 16 is a diagram graphically showing the condition for oxide-film penetration during implantation of boron (B).

In addition, there is shown in FIG. 16 a condition for penetration of the oxide film upon implantation of boron (B) ions. The lateral axis indicates the energy of such ions; the longitudinal axis shows the thickness of a silicon oxide film. Ordinarily, the equipment used to perform boron ion implantation is such that the ion energy (acceleration voltage) is limited at 50 to 60 kilo-electron-volts (KeV). By taking margins of the energy (acceleration voltage) into consideration along with the ion energy limit value, the silicon oxide film is required to have its thickness less than 100 nm. The boron ion implantation is for fabrication of a P$^+$-type diffusion layer 13 beneath the gate wiring line 15. Assuming that the thickness of oxide film 18 is less than 100 nm, the implantation that penetrates the oxide film 18 becomes possible, resulting in an increase in the degree of freedom or flexibility of the process concerned.

Figure 15:
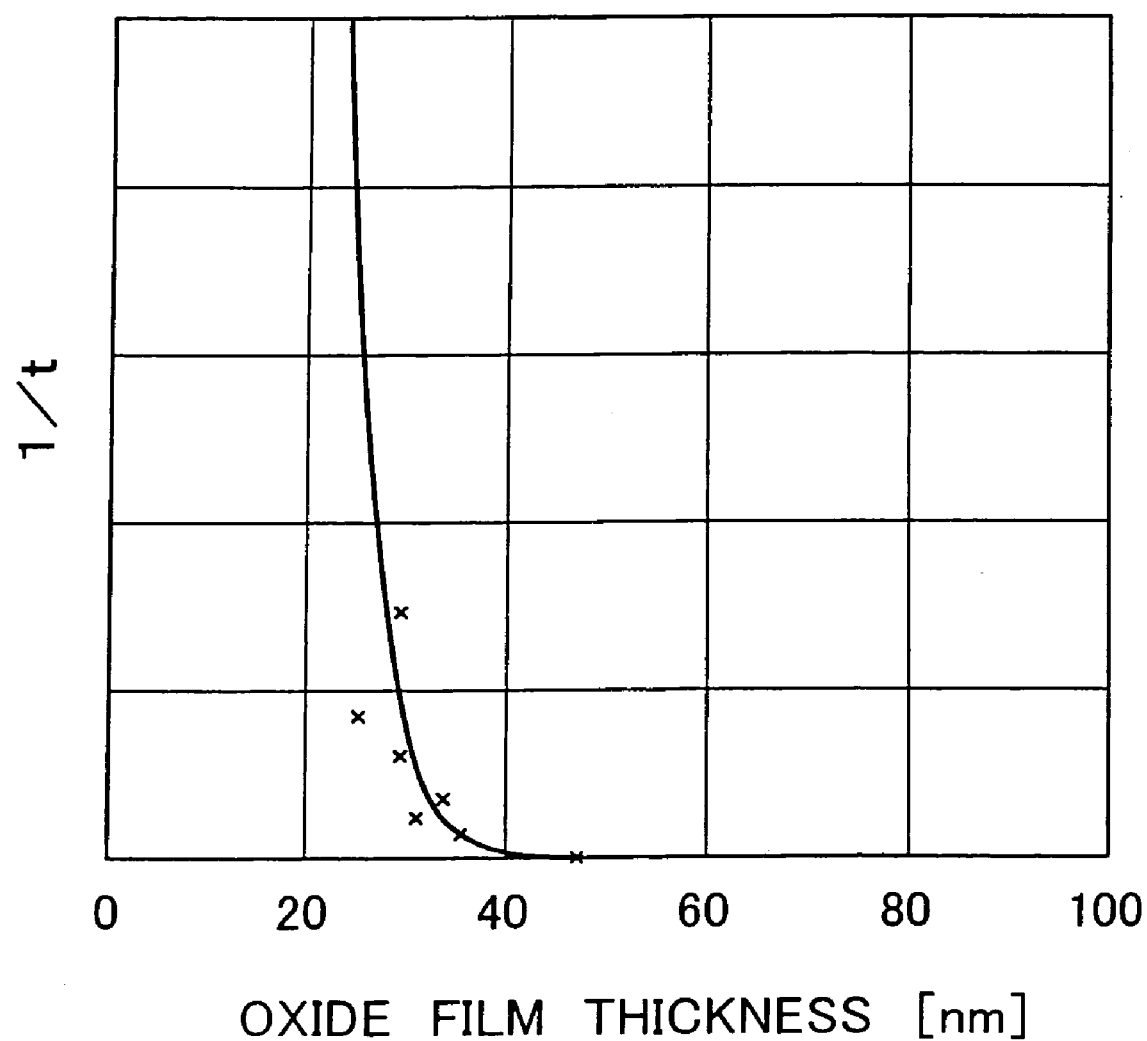
FIG. 15 is a diagram showing a graph demonstrating a with-time destruction distribution of oxide film thickness.

Hence, it can be seen from FIGS. 15 and 16 that when the thickness of the oxide film 18 is set at 40 nm or more and yet less than 100 nm, it is possible to ensure the reliability of the oxide film 18 while at the same time obtaining increased process flexibility.

As apparent from the foregoing, according to the MOSFET 100e in Embodiment 7, it is possible to form the oxide film 18 to an appropriate thickness which can withstand the local concentration of an electric field as created between the gate wiring line 15 and its underlying $P^+$-type diffusion layer 13 during high-temperature continuous current-flow tests with a negative or "minus" bias applied to the gate electrode. This in turn makes it possible to improve the reliability of MOSFET 100e in addition to the effects obtainable in Embodiment 1.

Figure 17:
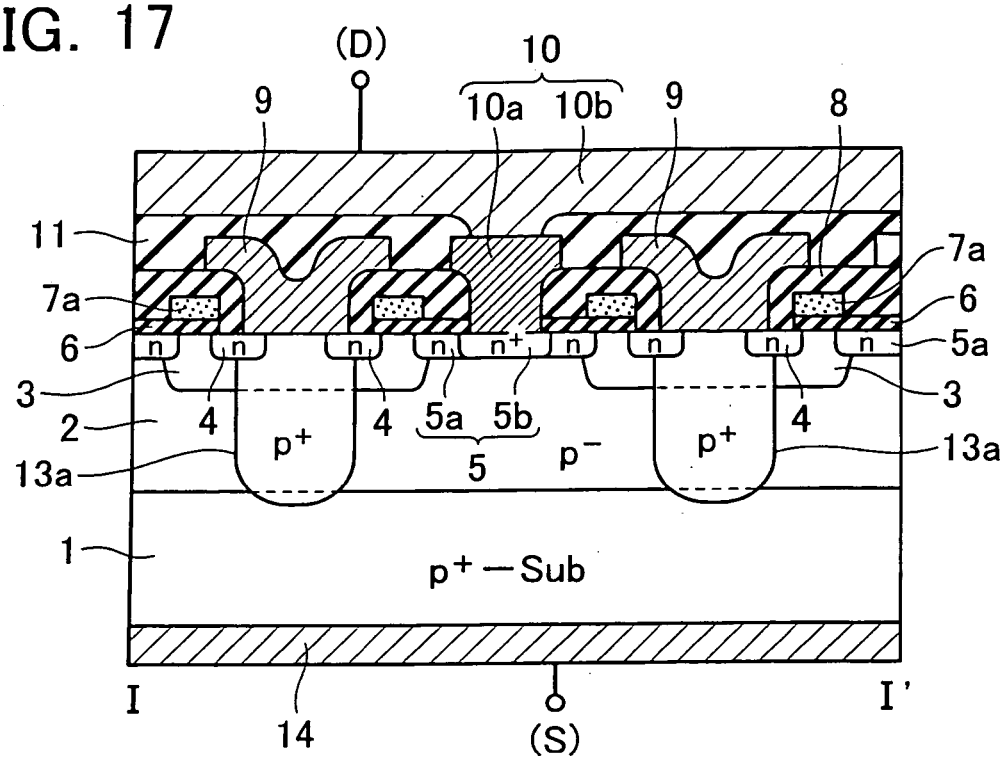
FIG. 17 is a sectional view of a MOSFET in accordance with a modification of the embodiment 7, which corresponds to FIG. 2.
Figure 18:
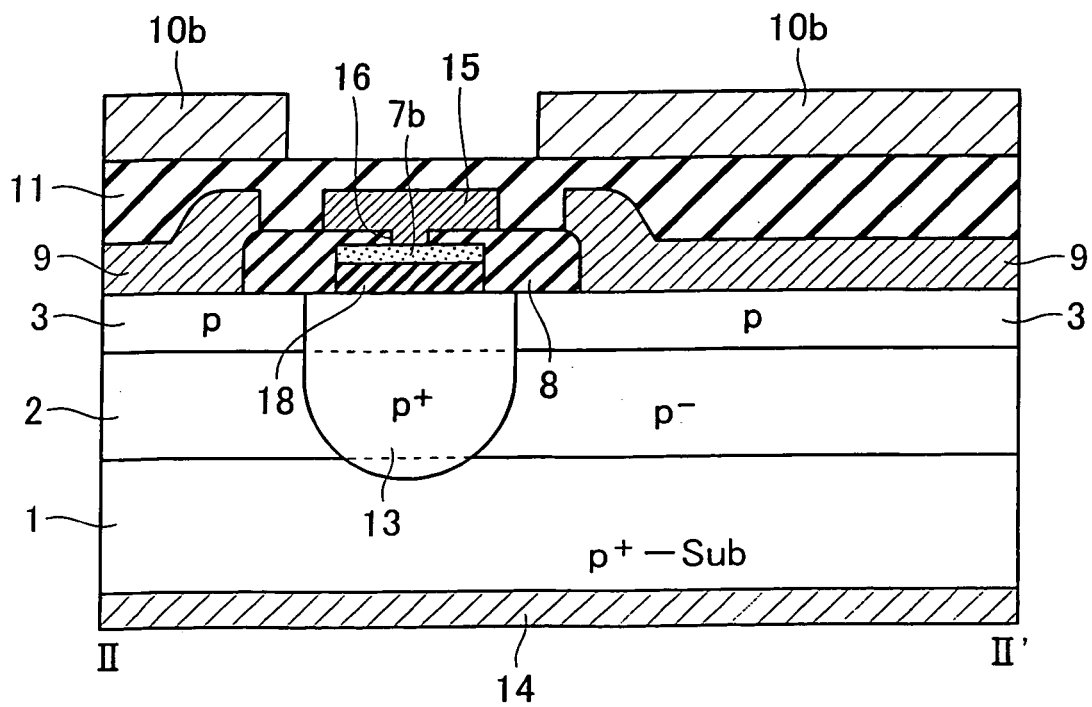
FIG. 18 is a sectional view of the MOSFET in accordance with the modification of the embodiment 7, which corresponds to FIG. 3.

There is a modified example of Embodiment 7, which will be explained with reference to FIGS. 17 and 18. These drawings show cross-sectional views which correspond to FIGS. 13 and 14 as for the MOSFET 100e in accordance with Embodiment 7. In this modification, it is also possible to form a $P^+$-type diffusion layer 13a (an example of another impurity diffusion layer of p-type) in the cell section also. In this case, the effect of microfabrication of the unit cells such as in Embodiment 1 is not obtained; instead, it is possible to improve the reliability of the MOSFET when compared to the prior art.

Embodiment 8

Figure 19:
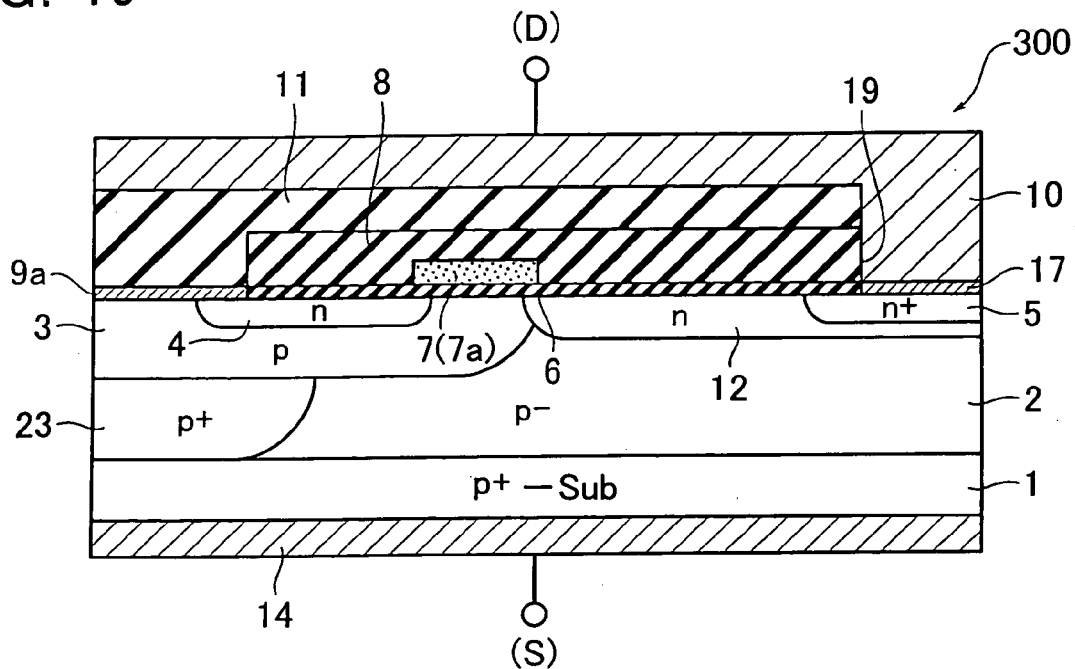
FIG. 19 illustrates in cross-section a MOSFET in accordance with an embodiment 8.

FIG. 19 shows a cross-sectional view of a MOSFET 300 in accordance with an embodiment 8. Parts or components corresponding to those of Embodiment 1 shown in FIG. 2 are denoted by the same reference characters, and a detailed explanation thereof is eliminated herein. The short electrode 9 as used in any one of the above-stated embodiments was constituted from the first-layer metal such as aluminum. In contrast, a short electrode 9a of Embodiment 8 is formed of a silicide (one example of metallic compound material) layer. This silicide layer is made of metal compound material that is a mixture of a high-melting-point metal (Ti, Co, Pt, Mo, W or else) and Si of the $p^-$-type epitaxial layer 2. In the MOSFET 300, the short electrode 9a is the silicide layer so that it is possible to form the short electrode 9a in a self-aligned fashion, which in turn makes it possible to further reduce the MOSFET in size—i.e., enables microfabrication of it. It should be noted that in the case of utilizing semiconductor material other than Si (such as GaAs, SiC, GaN, SiGe, C or else), a metal compound of the semiconductor other than Si and a high-melting-point metal becomes the material of the short electrode.

An n-type drift layer 12 is the one that is aimed at achievement of the withstanding or breakdown voltage required. This layer 12 is formed in the surface of the $p^-$-type epitaxial layer 2 while being spaced apart from a source layer 4. The drift layer 12 is formed by shallow doping or implantation of n-type ions into the $p^-$-type layer 2 with the gate electrode 7 as a mask. Whereby, it is possible to lessen the area of an overlap between the gate electrode 7 and the drift layer 12 without creating any possible deviation or offset between the gate electrode 7 and drift layer 12. Lessening this area enables the gate-to-drain capacitance to decrease accordingly. Thus it is possible to reduce an accumulated charge amount of the gate, thereby making it possible to shorten a switching time period.

An $n^+$-type drain layer 5 is formed in the drift layer 12 while providing a predetermined distance from the gate electrode 7. There is a silicide layer 17 on a surface of the drain layer 5, wherein the layer 17 is formed simultaneously during fabrication of a short electrode 9a. By utilizing a contact hole 19 which is formed in interlayer dielectric films 8, 11, a drain electrode 10 is in contact with the drain layer 5 through the silicide layer 17. A drain electrode 10 is disposed on the interlayer dielectric film 11, that is, on one surface side of the silicon substrate 1. In contrast, a source electrode 14 is disposed on the opposite surface side of silicon substrate 1 which is on the back side of one surface.

In a $p^-$-type layer 2 between the silicon substrate 1 and base layer 3, a $p^+$-type diffusion layer 23 is formed, which is deep enough to reach silicon substrate 1. The presence of such $p^+$-type diffusion layer 23 permits the short electrode 9a and silicon substrate 1 to be connected together. As the $p^-$-type layer 2 becomes a parasitic source resistance component and also acts as a resistor upon power-up, the $p^+$-type diffusion layer 23 is provided to reduce the resistance of the $p^-$-type layer 2.

Figure 20:
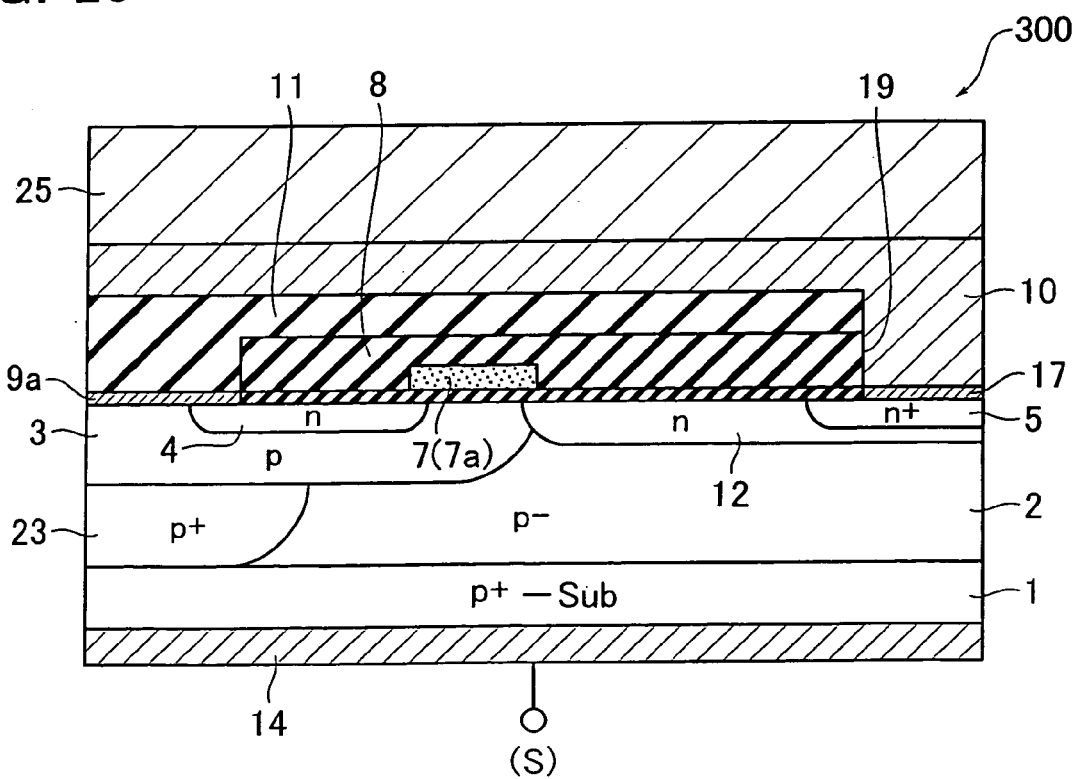
FIG. 20 depicts in cross-section the MOSFET of FIG. 19 with a wiring electrode attached thereto.
Figure 29:
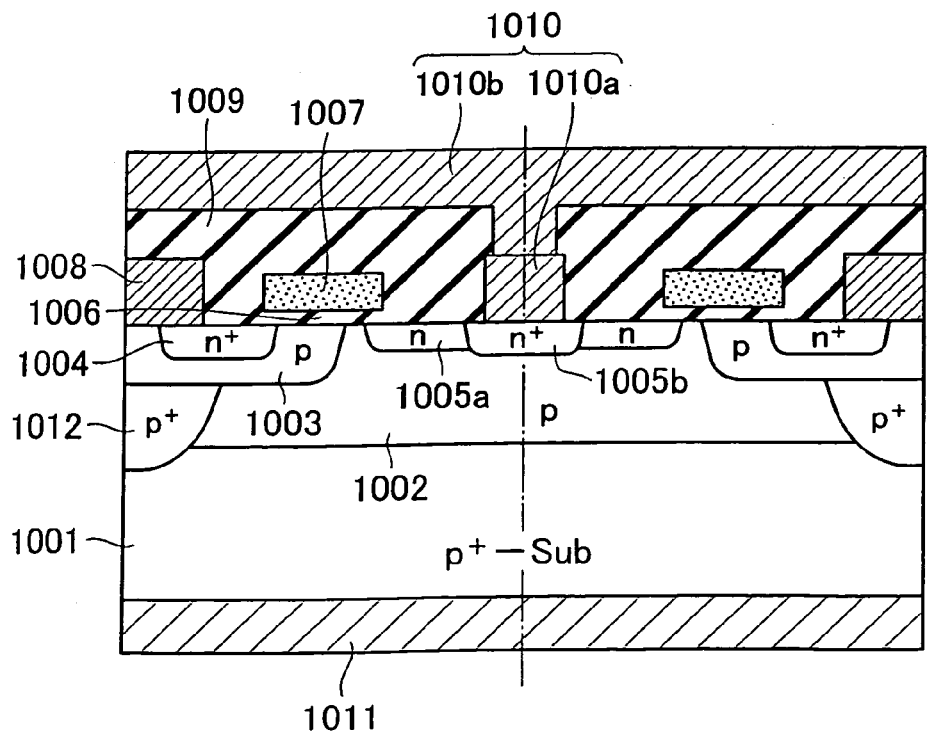
FIG. 29 is a sectional diagram of one prior art MOSFET.

Referring next to FIG. 20, the MOSFET 300 is connected to more than one external wiring lead (not shown) by bonding the drain electrode 10 to a wiring electrode 25 which is attached to the external wiring lead such as an electrical wire. In the prior art MOSFET shown in FIG. 29, let a wiring electrode (not shown) be bonded to a second-layer metal 1010b of drain electrode 1010. In either case, the wiring electrode is connected by bonding to the drain electrode at part overlying the gate electrode, source layer, drain layer, base layer and short electrode. In the MOSFET of FIG. 29, the wiring electrode is bonded not to the first-layer metal 1010a but to the second-layer metal 1010b for the reason which follows.

For enabling flow of a large current, power MOSFETs are inherently large in cross-sectional area, resulting in a likewise increase in area of the wiring electrode. Accordingly, the drain electrode also must increase in area. Thus, a need is felt to cover the entire surface of a MOSFET chip with the drain electrode, by way of example. Since in the MOSFET of FIG. 29 both the first-layer metal 1010a and the short electrode 1008 are formed at a time for purposes of simplification of fabrication processes, it is impossible to acquire any necessary area for connection with the wiring electrode at the first-layer metal 1010a. Consequently, the second-layer metal 1010b is formed causing the wiring electrode to be attached to the second-layer metal 1010b.

Accordingly, in the MOSFET of FIG. 29, a technique for fabricating the first-layer metal and the second-layer metal—that is, the multilayer wiring technique—becomes necessary. Also required is a technique for planarization of an interlayer dielectric film 1009 in order to avoid stair step-like surface configurations of the interlayer dielectric film 1009 otherwise occurring due to the presence of the short electrode 1008. This causes a problem as to an increase in manufacturing process step number and an increase in production costs. Further, due to the planarization of the interlayer dielectric film 1009, part of the interlayer dielectric film 1009 which overlies the short electrode 1008 becomes thinner than the remaining part thereof. For this reason, the part overlying the short electrode 1008 (in particular, portions adjacent to the corners of short electrode 1008) is readily damageable by shocks due to the application of ultrasonic waves and/or loads during bonding (for example, cracks can take place at such portions), which in turn causes problems such as a decrease in production yield and a decrease in reliability of the MOSFET.

On the contrary, the MOSFET 300 of Embodiment 8 shown in FIG. 19 is arranged to employ a silicide layer for use as the short electrode 9a. Thus it is possible to constitute the drain electrode 10 by the first-layer metal alone without designing it to have a multilayer wiring structure of the first-layer metal and the second-layer metal. Additionally, the silicide layer is less in thickness (e.g. smaller than the thickness of the interlayer dielectric film 8) so that a step-like surface configuration or planar irregularity occurring at the interlayer dielectric film 11 that covers the short electrode 9a stays less. Therefore, any planarization process of the interlayer dielectric film 11 is no longer required. As apparent from the foregoing discussion, according to this embodiment, both the multilayer wiring technique and the planarization technique become unnecessary so that it is possible to lessen the number of fabrication process steps while at the same time reducing manufacturing costs.

In addition, as previously stated, the short electrode 9a stays less in thickness and any planarization process of the interlayer dielectric film 11 is no longer required; thus, part of the interlayer dielectric film 11 which overlies the short electrode 9a hardly becomes thinner than the other part thereof. Accordingly, when bonding the wiring electrode 25 of FIG. 20 to the drain electrode 10, the part overlying the short electrode 9a is free from the risk of damageability, thereby enabling the MOSFET 300 to improve in production yields and in reliability.

Figure 21:
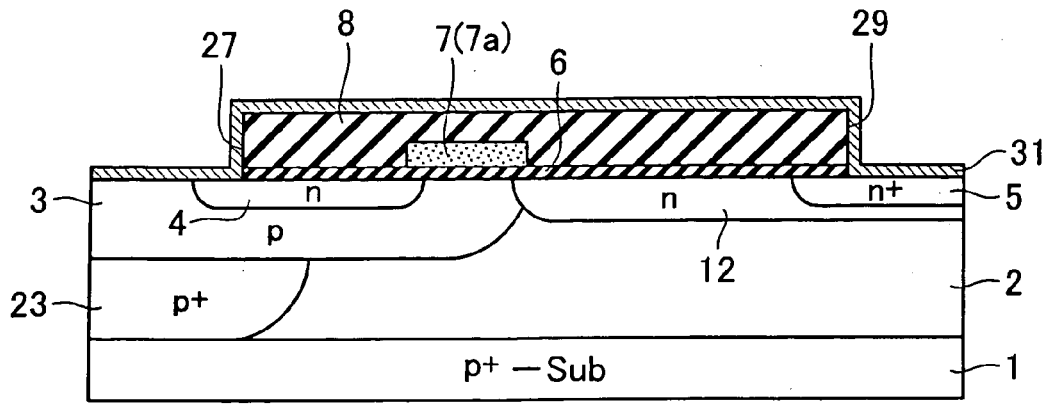
FIG. 21 is a first process drawing for explanation of a fabrication method of the MOSFET in accordance with the embodiment 8.
Figure 22:
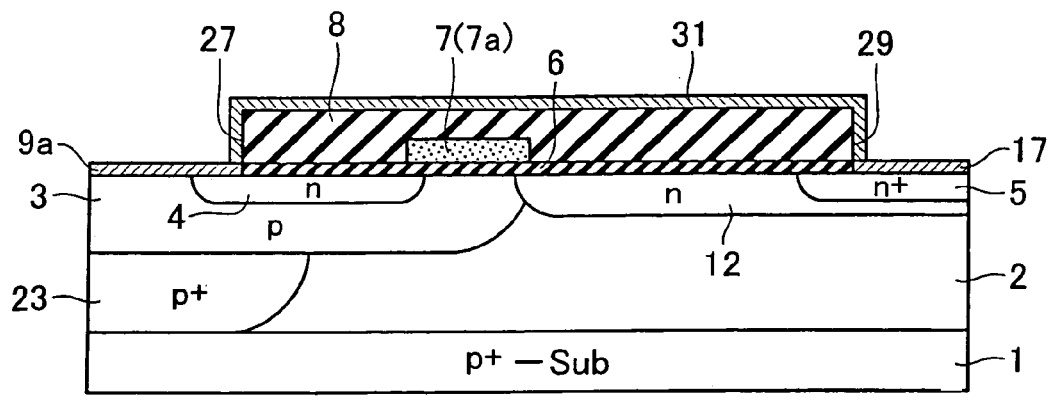
FIG. 22 is a second process drawing for explanation of the fabrication method of the MOSFET in accordance with the embodiment 8.
Figure 23:
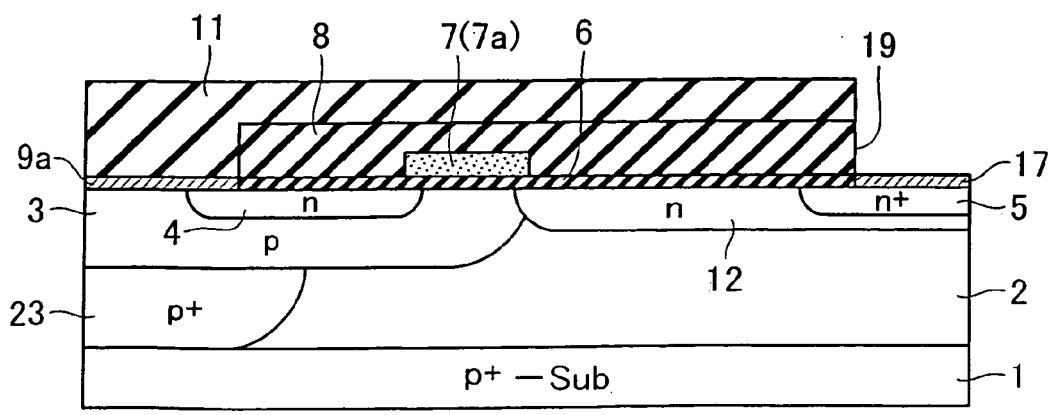
FIG. 23 is a third process drawing for explanation of the fabrication method of the MOSFET in accordance with the embodiment 8.

A brief explanation will be given of a process included in the fabrication method of the MOSFET 300 in accordance with the embodiment 8, which process covers from the formation of the short electrode 9a up to the formation of the source electrode 14. FIGS. 21 to 23 are process diagrams each showing a cross-section of a silicon substrate or the like for explanation of this process.

As shown in FIG. 21, form an interlayer dielectric film 8 (an example of the first-layer dielectric film) over a p⁻-type epitaxial layer 2 so that the film 8 covers a gate electrode 7. The interlayer dielectric film 8 is comprised of a silicon oxide film or the like. Then, perform photolithography and etching processes to define openings 27, 29 in this layer 8. The opening 27 is for exposure of a region which includes the boundary or interface between a base layer 3 and source layer 4. The opening 29 permits exposure of the region of a drain layer 5. Next, let a Ti film 31 be vapor-deposited by sputtering or else on an entire surface of the interlayer dielectric film 8, which includes the regions thus exposed by these openings 27, 29.

As shown in FIG. 22, apply thermal processing to the silicon substrate 1 of FIG. 21 at temperatures higher than or equal to 400° C., causing the Ti film 31 and the p⁻-type epitaxial layer 2 to react with each other. Whereby, a silicide layer (short electrode 9a, silicide layer 17) is formed to overlie the region including the boundary between the base layer 3 and source layer 4 and the region of drain layer 5. A top surface of the interlayer dielectric film 8 and portions of the Ti film 31 on sidewalls of the openings 27, 29 are kept unreacted; thus, remove them by etching. By the process stated above, the short electrode 9a and the silicide layer 17 are formed in a self-aligned fashion to a prespecified thickness less than or equal to 100 nm.

As shown in FIG. 23, deposit an interlayer dielectric film 11 (an example of the second-layer dielectric film) by chemical vapor deposition (CVD) for example in such a way as to cover the short electrode 9a and silicide layer 17 plus interlayer dielectric film 8. This film 11 is formed of a silicon oxide film or the like. Thereafter, selectively remove the interlayer dielectric film 11 by photolithography and etching processes to thereby form on the drain layer 5 a contact hole 19 in such a manner as to expose the silicide layer 17.

And, execute sputtering, for example, to vapor-deposit a metal such as aluminum or else on the interlayer dielectric film 11 and also within the contact hole 19, thereby forming the drain electrode 10 of FIG. 19. Next, apply polishing or rubbing treatment to the back surface of the silicon substrate 1 until this silicon substrate 1 has a predetermined thickness. Thereafter, vaporize by sputtering a metal (Au, Al, V, Ni, Cu or the like) on this back surface, thus forming the source electrode 14 of FIG. 19.

Embodiment 9

Figure 24:
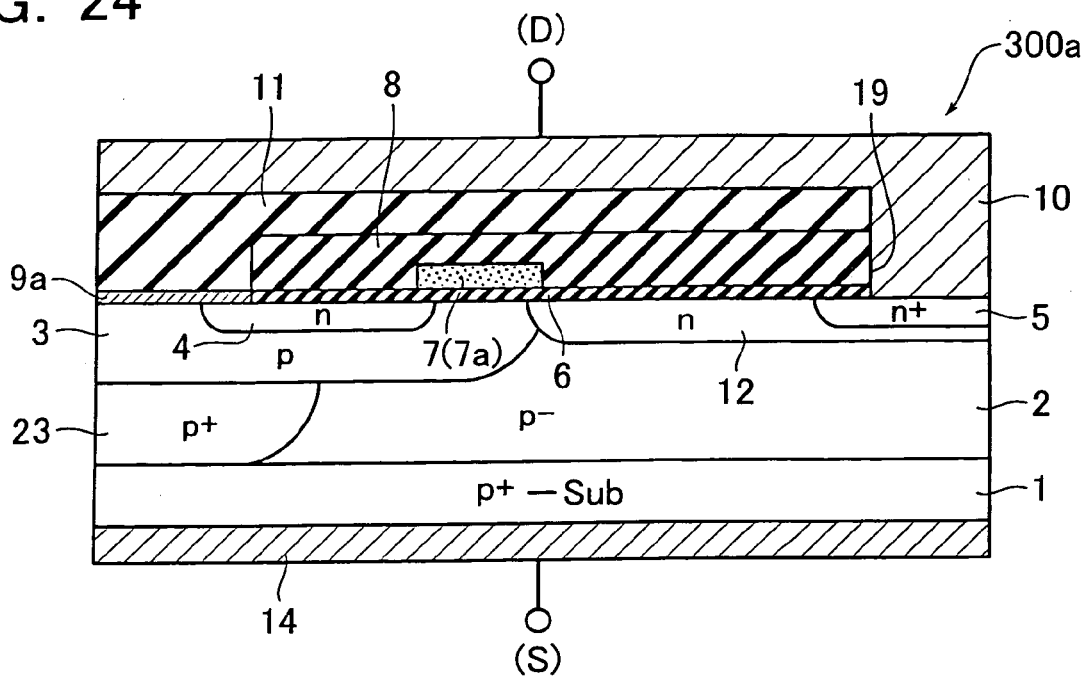
FIG. 24 shows a cross-section of a MOSFET in accordance with an embodiment 9.

FIG. 24 shows a sectional view of a MOSFET 300a in accordance with an embodiment 9. Parts or components corresponding to those of Embodiment 8 shown in FIG. 19 are designated by the same reference numerals, and a detailed explanation thereof is eliminated herein. Although in this embodiment a silicide layer which constitutes the short electrode 9a is formed on the source layer 4 and base layer 3 in a similar way to Embodiment 8, any silicide layer is not formed on the drain layer 5 unlike Embodiment 8. Due to this, the drain electrode 10 is in direct contact with the drain layer 5. An effect obtainable thereby will be explained below.

After having formed the contact hole 19, remove a natural oxide film as formed at the bottom of the contact hole 19; then, form a drain electrode 10. As the natural oxide film removal method, a reverse sputter method is generally employed because of its advantage of low costs. However, the MOSFET 300 shown in FIG. 19 is such that the bottom of the contact hole 19 is the silicide layer 17 and is very thin, which would result in the silicide layer 17 disappearing due to damages of such reverse sputtering. If the natural oxide film is removed away by use of an HF-based chemical solution in place of the reverse sputter method, then it is possible to prevent such disappearance. However, with this method, reactive products of water and Si can readily generate at the bottom of the contact hole 19 at a process step between pure-water washing and drying treatment steps after completion of the processing using chemical liquids. This can cause contact defects and thus requires execution of new special processing.

In view of this, in the MOSFET 300a of this embodiment, no openings are formed on or above the region of drain layer 5 during formation of an opening(s) for silicide layer formation in the interlayer dielectric film 8, thereby preventing formation of any silicide layer on the drain layer 5. With such a scheme, the bottom of the contact hole 19 becomes the drain layer 5; thus, it becomes possible to remove any natural oxide film by reverse sputter methods.

Additionally, in case the drain electrode 10 is made of aluminum, what is called the spike phenomena will possibly occur—that is, the contact between the drain electrode 10 and drain layer 5 is often destroyed as a result of undesired accommodation of Si residing within the p⁻-type epitaxial layer 2 into an aluminum film during high-temperature thermal processing in the manufacture of the drain electrode 10. To avoid this risk, let a barrier metal such as Ti or TiW or else be interposed between the drain electrode 10 and the drain layer 5.

Embodiment 10

Figure 25:
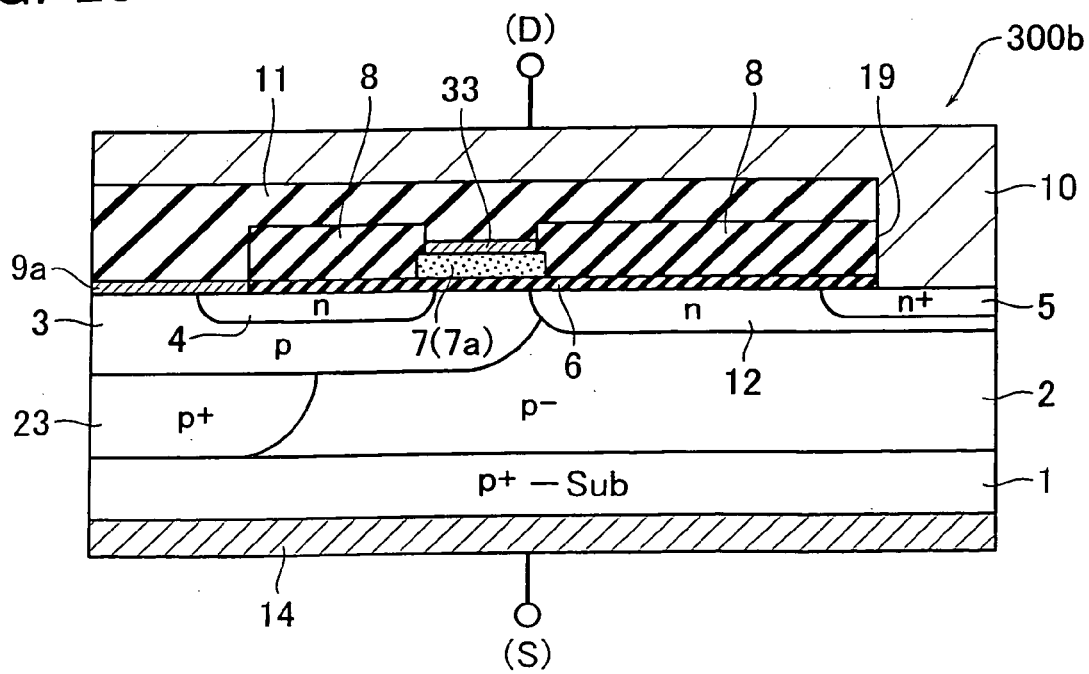
FIG. 25 shows a cross-section of a MOSFET in accordance with an embodiment 10.

FIG. 25 shows a sectional view of a MOSFET 300b in accordance with an embodiment 10. Parts or components corresponding to those of Embodiment 8 shown in FIG. 19 are denoted by the same reference numerals, with a detailed explanation thereof eliminated herein. In this embodiment, a silicide layer (silicide layer 33) is formed also on the gate electrode 7. Whereby, the gate electrode 7 decreases in wiring resistance, thus enabling enhancement of high-speed switching performance. The silicide layer 33 is formed simultaneously during formation of the short electrode 9a, by forming an opening on or above the gate electrode 7 also when forming the opening for silicide layer formation in the interlayer dielectric film 8. Thus it becomes possible to reduce the wiring resistance of the gate electrode 7 without having to increase the number of manufacturing process steps. Note here that any silicide layer is not formed on the drain layer 5 in a similar way to the MOSFET 300a shown in FIG. 24.

Embodiment 11

Figure 26:
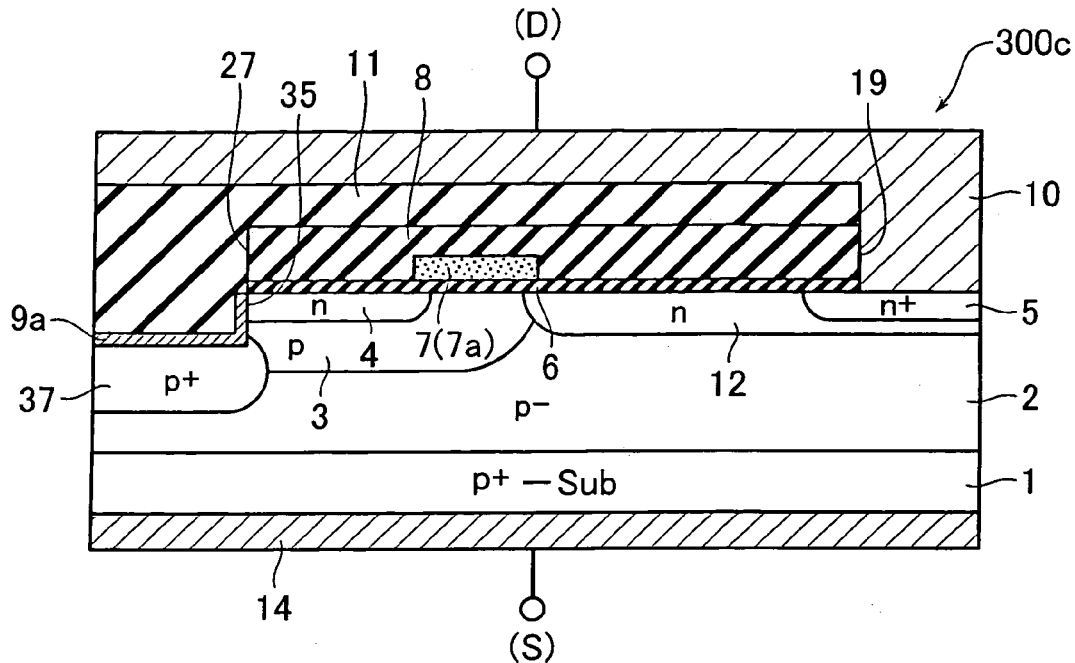
FIG. 26 shows a cross-section of a MOSFET in accordance with an embodiment 11.

FIG. 26 depicts a sectional view of a MOSFET 300c in accordance with an embodiment 11. Parts or components corresponding to those of Embodiment 8 shown in FIG. 19 are designated by the same reference numerals, and a detailed explanation thereof is eliminated herein. A p⁻-type epitaxial layer 2 of this embodiment has a trench 35 formed in the base layer 3 so that a specific portion of the terminate ends of the source layer 4 which is on the opposite side to the gate electrode 7 is included therein. A short electrode 9a is formed in the trench to cover its bottom portion and sidewall portion. A p⁺-type diffusion layer 37 is formed in the p⁻-type epitaxial layer 2 that underlies the trench 35. This layer 37 is higher in impurity concentration than the base layer 3. Layer 37 is an alternative to the p⁺-type diffusion layer 23 shown in FIG. 19. Note that any silicide layer is not formed on or above the drain layer 5 in a similar way to the MOSFET 300a shown in FIG. 24.

A fabrication method of the characteristic part of the MOSFET 300c will be explained below. First, use photolithography and etching processes to form in the interlayer dielectric film 8 an opening 27 for exposure of the region including the boundary between the base layer 3 and source layer 4. With the interlayer dielectric film 8 as a mask, selectively remove the p⁻-type epitaxial layer 2 by reactive ion etching (RIE) techniques to thereby form a trench 35. This trench 35 has its depth which is between the depth of source layer 4 and the depth of base layer 3.

With the interlayer dielectric film 8 as a mask, dope a p-type impurity by ion implantation into the trench 35 to thereby form a shallow p⁺-type diffusion layer 37 in the p⁻-type layer 2. Although the p⁺-type diffusion layer 37 does not reach the silicon substrate 1, this layer functions as an impurity diffusion layer for causing the source layer 4 to extend up to the silicon substrate 1. This can be said because thermal processing for formation of the drift layer 12 and base layer 3 results in a p-type impurity attempting to outdiffuse or "exude" toward the p⁻-type layer 2 from the silicon substrate 1 of heavily-doped p (p⁺) conductivity type, causing a portion between the p⁺-type diffusion layer 37 and silicon substrate 1 to have p-type conductivity of relatively high impurity concentration. As apparent from the foregoing discussion, this embodiment is capable of making the p⁺-type diffusion layer 37 shallower, thereby making it possible to suppress or minimize unwanted lateral diffusion of the p⁺-type diffusion layer 37. This in turn enables the MOSFET 300c to further shrink into ultrafine sizes.

Next, after having deposited by sputtering or other similar suitable techniques a Ti film on an entire surface of the interlayer dielectric film 8 in such a manner as to include bottom and sidewall portions of the trench 35, form a short electrode 9a by using a method similar to that in the embodiment 8 as has been explained in FIG. 22. The short electrode 9a is made up of a silicide layer. Then, deposit by CVD methods an interlayer dielectric film 11 on the interlayer dielectric film 8 so that the trench 35 is buried therein. As this embodiment is such that any silicide layer is not formed on the drain layer 5, the following process is the same as that of the embodiment 9 shown in FIG. 24.

Embodiment 12

Figure 27:
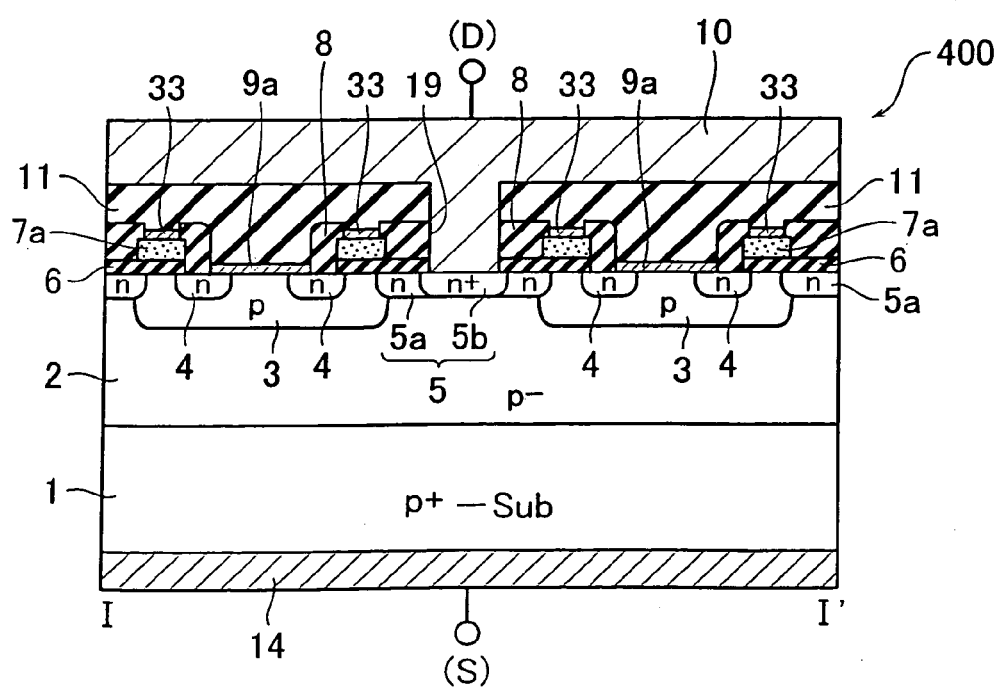
FIG. 27 is a sectional diagram of a MOSFET in accordance with an embodiment 12, which corresponds to FIG. 2.
Figure 28:
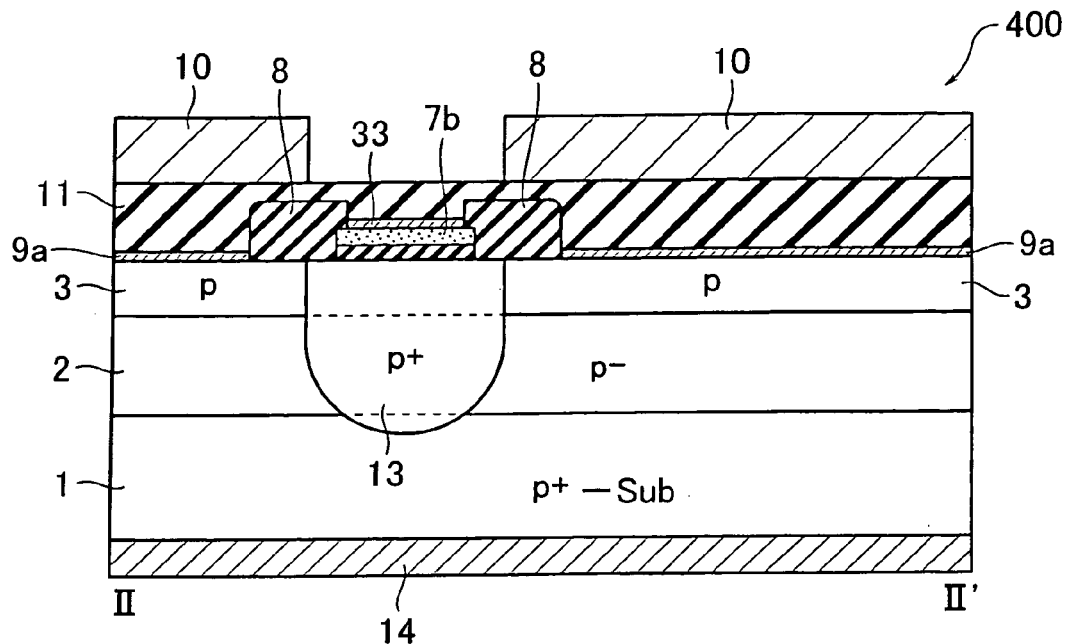
FIG. 28 is a sectional diagram of the MOSFET in accordance with the embodiment 12, which corresponds to FIG. 3.

FIGS. 27 and 28 show sectional views of a MOSFET 400 in accordance with an embodiment 12. FIG. 27 corresponds to FIG. 2 of the Embodiment 1; FIG. 28 corresponds to FIG. 3 of Embodiment 1. Components corresponding to those of Embodiment 1 are designated by the same reference numerals, with a detailed explanation thereof eliminated herein. This embodiment is a combination of Embodiment 1 and Embodiment 10 of FIG. 25. More specifically, it becomes possible to achieve enhanced microfabrication and higher integration density of the unit cells, by forming a p⁺-type diffusion layer 13 at a location immediately beneath the coupler portion 7b of gate electrode 7, which layer 13 is for electrode take-out purposes. Additionally, the short electrode 9a is formed of a silicide layer, with a silicide layer 33 formed on the gate electrode 7 also. Letting the short electrode 9a be such silicide layer makes it possible to lessen the manufacturing process step number while at the same time reducing production costs and also enabling the MOSFET 400 to further improve in yields and reliability.

It has been stated that according to the semiconductor device incorporating the principles of this invention, it is possible to realize further shrinkage in size of vertically structured transistors by enabling microfabrication and higher on-chip integration density of the unit cells.

While the present invention has been particularly shown and described with reference to the embodiments, it will be understood by those skilled in the art that various changes in form and detail may be made without departing from the spirit, scope, and teachings of the invention.

What is claimed is:
1. A semiconductor device, comprising:
 a semiconductor substrate having an upper surface and a lower surface;
 a semiconductor layer formed on said upper surface of said semiconductor substrate;
 a base layer of a first conduction type formed in said semiconductor layer;
 a gate electrode formed on said semiconductor layer with a gate insulator interposed therebetween;
 a source layer of a second conduction type formed in said base layer;
 a drain layer of said second conduction type formed in said semiconductor layer;
 a first interlayer insulator formed on said semiconductor layer to cover said gate electrode;
 a short electrode formed to short between said base layer and said source layer, a part of said short electrode overlapping said gate electrode with said first interlayer insulator interposed therebetween;
 a second interlayer insulator formed to cover said first interlayer insulator and said short electrode;
 a drain electrode formed on said second interlayer insulator and connected to said drain layer via a contact hole formed through said first and second interlayer insulators; and
 a source electrode formed on said lower surface of said semiconductor substrate.

2. The semiconductor device according to claim 1, further comprising:

an impurity-diffused layer of said first conduction type formed in said semiconductor layer immediately beneath said source layer to a depth reaching said semiconductor substrate to lead said source layer to said semiconductor substrate, said impurity-diffused layer having a higher impurity concentration than that of said base layer.

3. The semiconductor device according to claim 1, wherein said short electrode has a side positioned above said gate electrode on said first interlayer insulator.

4. The semiconductor device according to claim 1, wherein said drain electrode covers said short electrode with said second interlayer insulator interposed therebetween.

5. The semiconductor device according to claim 1, further comprising:

a plurality of unit cells each including said gate electrode, said source layer and said drain layer formed in arrayed stripes;

a gate line formed to couple said gate electrode in each unit cell with each other; and an impurity-diffused layer formed in said semiconductor layer to a depth reaching said semiconductor substrate to lead said source layer in each unit cell to said semiconductor substrate, said impurity-diffused layer being positioned immediately beneath said gate line in each unit cell and not immediately beneath said source layer.

6. The semiconductor device according to claim 1, wherein said semiconductor substrate is of P-type.

* * * * *